(12) United States Patent
Mohanty et al.

(10) Patent No.: US 9,053,276 B2
(45) Date of Patent: Jun. 9, 2015

(54) METHODOLOGY FOR NANOSCALE TECHNOLOGY BASED MIXED-SIGNAL SYSTEM DESIGN

(71) Applicant: University of North Texas, Denton, TX (US)

(72) Inventors: Saraju P. Mohanty, Denton, TX (US); Elias Kougianos, Denton, TX (US)

(73) Assignee: University of North Texas, Denton, TX (US)

( * ) Notice: Subject to any disclaimer, the term of this patent is extended or adjusted under 35 U.S.C. 154(b) by 0 days.

(21) Appl. No.: 13/928,786

(22) Filed: Jun. 27, 2013

(65) Prior Publication Data

US 2014/0173537 A1    Jun. 19, 2014

Related U.S. Application Data

(60) Provisional application No. 61/670,512, filed on Jul. 11, 2012.

(51) Int. Cl.
*G06F 17/50* (2006.01)

(52) U.S. Cl.
CPC .......... *G06F 17/5063* (2013.01); *G06F 17/505* (2013.01)

(58) Field of Classification Search
CPC .............. G06F 17/5045; G06F 17/505; G06F 17/5022; G06F 17/5068; G06F 17/5054; G06F 17/5036; G06F 17/5081; G06F 17/5077
USPC .......................... 716/103, 104, 111, 115, 132
See application file for complete search history.

(56) References Cited

U.S. PATENT DOCUMENTS

| | | | |
|---|---|---|---|
| 6,637,018 B1 | 10/2003 | Demler | |
| 7,086,020 B2 | 8/2006 | Chen et al. | |
| 7,251,795 B2 | 7/2007 | Biswas et al. | |
| 7,304,544 B2 | 12/2007 | Colleran et al. | |
| 7,356,784 B1 * | 4/2008 | Dengi et al. | 716/113 |
| 7,533,358 B2 * | 5/2009 | Gopalakrishnan et al. | 716/135 |
| 7,735,048 B1 * | 6/2010 | Zhang et al. | 716/104 |
| 2006/0074617 A1 * | 4/2006 | Chakravarty et al. | 703/13 |
| 2007/0226659 A1 * | 9/2007 | Suaya et al. | 716/1 |

OTHER PUBLICATIONS

Garitselov, Oleg, et al: Bee Colony Inspired Metamodeling Based Fast Optimization of a Nano-CMOS PLL; 2011 International Symposium on Electronics System Design; 2011, pp. 6-11.

(Continued)

*Primary Examiner* — Vuthe Siek
(74) *Attorney, Agent, or Firm* — Jackson Walker L.L.P.

(57) ABSTRACT

A method for designing complex, mixed signal circuits, comprising generating electronic data defining a baseline schematic design. Generating a parameterized parasitic-aware netlist using the baseline schematic design. Performing design and process parameter statistical optimization using the parameterized parasitic-aware netlist and mixed signal component specifications. Determining whether one or more predetermined design specifications are satisfied. Optimizing the parameterized parasitic-aware netlist if it is determined that the one more predetermined design specifications are not satisfied. Generating electronic data defining a schematic-optimal layout design if it is determined that the one or more predetermined design specifications are satisfied.

14 Claims, 19 Drawing Sheets

(56) References Cited

OTHER PUBLICATIONS

Garitselov, Oleg, et al; A Comparative Study of Metamodels for Fast and Accurate Simulation of Nano-CMOS Circuits; IEEE Transactions on Semiconductor Manufacturing, vol. 25, No. 1, Feb. 2012, pp. 26-36.

Garitselov, Oleg, et al; Fast—Accurate Non-Polynomial Metamodeling for Nano-CMOS PLL Design Optimization; 2012 25th Internationl Conference of VLSI Design; 2012, pp. 316-321.

Garitselov; Oleg, et al; Fast Optimization of Non-CMOS Mixed-Signal Circuits Through Accurate Metamodeling; 12th Int'l Symposium on Quality Electronics Design, 2011, pp. 405-410.

Ghai, Dhruva, et al; Design of Parasitic and Process-Variation Aware Nano-CMOS RF Circuits: A VCO Cast Study; IEEE Transactions on Very Large Scale Integration (VLSI) Systems, vol. 17, No. 9, Sep. 2009, pp. 1339-1342.

Mohanty, Saraju P., et al; A P4VT (Power-Performance-Process-Parasitic-Voltage-Temperature) Aware Dual-VTh Nano-CMOS VCO; 2010 23rd International Conference on VLSI Design, 2010, pp. 99-104.

Okobiah, O., et al; Kriging-Assisted Ultra-Fast Simulated-Annealing Optimization of a Clamped Bitline Sense Amplifier; 2012 25th International Conference on VLSI Design; 2012, pp. 310-315.

* cited by examiner

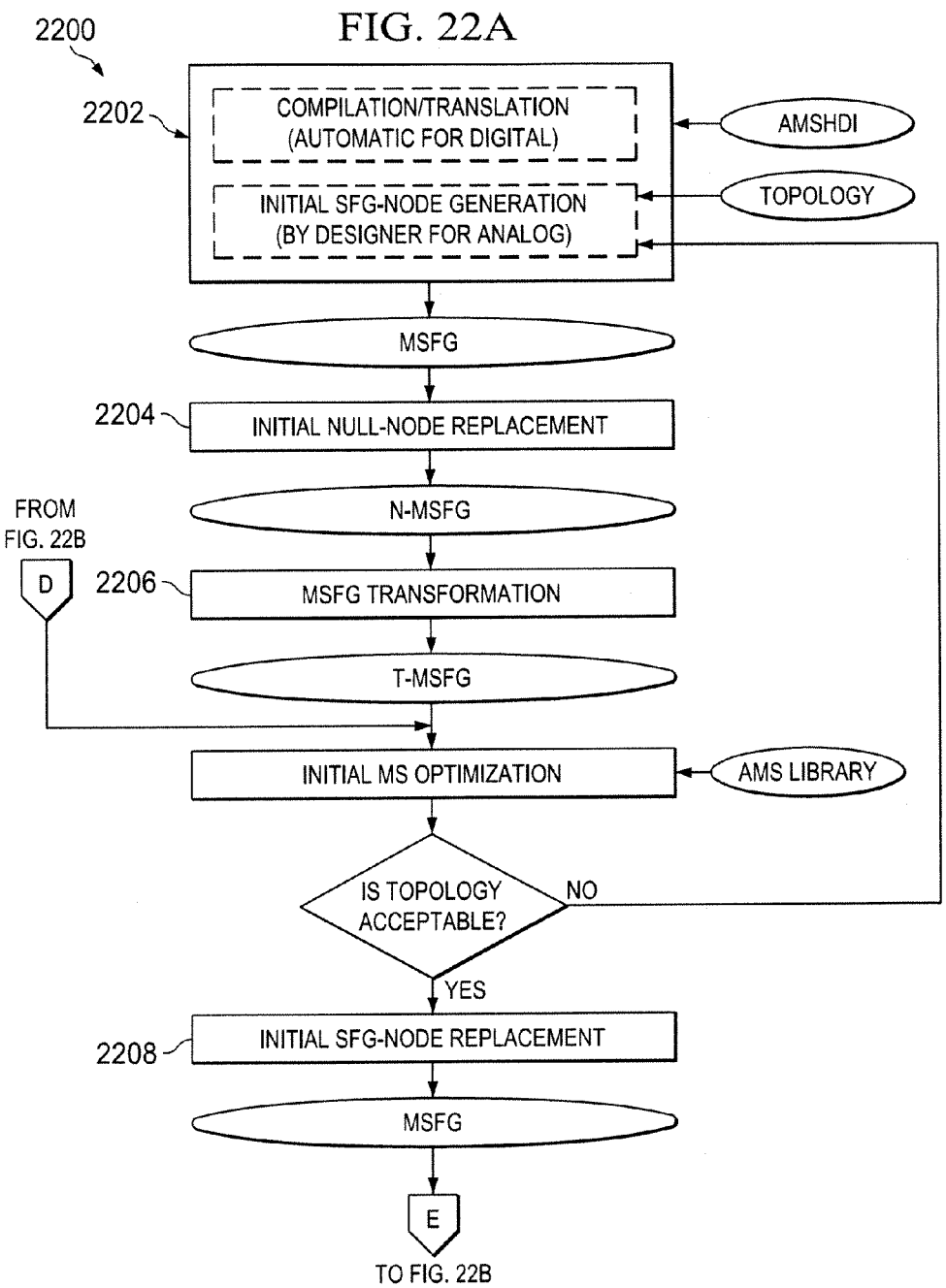

METHODOLOGY FOR NANOSCALE TECHNOLOGY BASED MIXED-SIGNAL SYSTEM DESIGN

This application claims the benefit of U.S. Provisional Patent Application Ser. No. 61/670,512, entitled METHODOLOGY FOR NANOSCALE TECHNOLOGY BASED MIXED-SIGNAL SYSTEM DESIGN, filed on Jul. 11, 2012, the entire content of which is hereby incorporated by reference.

TECHNICAL FIELD

The present disclosure relates generally to nanoscale technology based mixed-signal system design, and more specifically to an ultra-fast simultaneous power, performance, parasitic, process-variation, voltage-variation, and thermal-variation aware methodology for nanoscale technology based mixed-signal system design.

BACKGROUND

The design of complex integrated circuits that utilize nanoscale integrated circuit fabrication techniques requires extensive manual activity. While computer modeling algorithms exist for simple designs, as design complexity increases, simplifying assumptions must be made in order to automate design processes. As a result, there are still many inefficiencies experienced in the design of complex integrated circuits that utilize nanoscale integrated circuit fabrication techniques.

SUMMARY

A method for designing complex, mixed signal circuits is disclosed that includes generating electronic data defining a baseline schematic design. A parameterized parasitic-aware netlist is generated using the baseline physical design, and design and process parameter statistical optimization is performed using the parameterized parasitic-aware netlist and mixed signal component specifications. If it is determined that one more predetermined design specifications are not satisfied, the parameterized parasitic-aware netlist is optimized. Otherwise, electronic data defining a schematic-optimal layout design is generated if it is determined that the predetermined design specifications are satisfied.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which:

FIG. 7A shows the steps of the algorithm leading up to performing schematic-optimal layout design, and the figure is continued to FIG. 7B, which shows the steps of the algorithm resulting in a mixed-signal component optimal layout;

FIG. 14A shows the steps of the algorithm leading up to performing a design rule check, and the figure is continued to FIG. 14B, which shows the steps of the algorithm resulting in a mixed signal component optimal layout;

FIG. 17A shows the steps of the algorithm leading up to a schematic-optimal layout, and the figure is continued to FIG. 17B, which shows the steps of the algorithm resulting in a mixed signal component optimal layout;

FIGS. 22A and 22B are flowcharts of an algorithm for AMS-SoC optimization flow for fast and accurate design space exploration, in accordance with an exemplary embodiment of the present disclosure. FIG. 22A shows the steps leading up to MSFG, and the figure is continued to FIG. 22B, which shows the steps of the algorithm resulting in a P4VT-OPTIMAL AMS-SoC layout.

DETAILED DESCRIPTION OF THE INVENTION

Figures 1, 2:
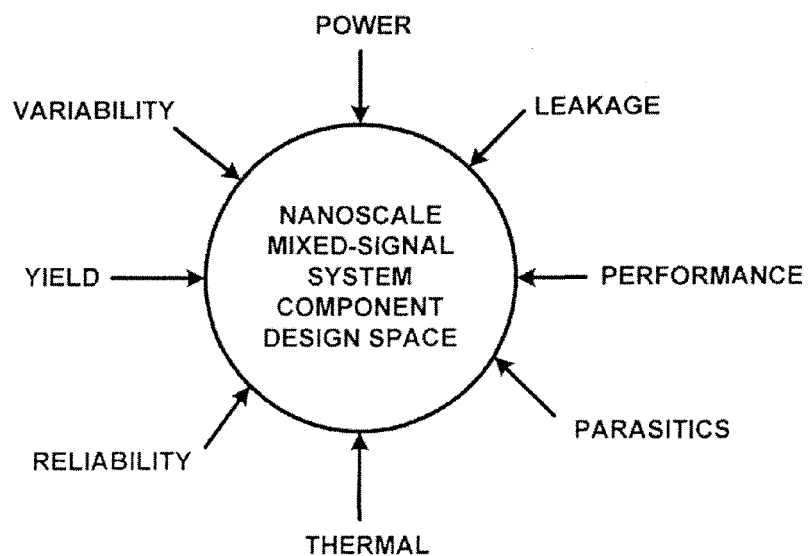
FIG. 1 is a diagram of a modeling architecture in accordance with an exemplary embodiment of the present disclosure.
FIG. 2 is a diagram showing design requirements that are correctly modeled during the design process in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

In a radio-frequency integrated circuit (RFIC), multiple manual iterations between the front-end circuit design and back-end layout are required to achieve parasitic closure, such as disclosed in X. Wang, S. McCracken, A. Dengi, K. Takinami, T. Tsukizawa, and Y. Miyahara, "A Novel Parasitic-Aware Synthesis and Verification Flow for RFIC Design," in Proceedings of the 36th European Microwave Conference, 2006, pp. 664-667, [Wang-2006], which is hereby incorporated by reference. It is assumed that the manual process requires X number of iterations, where X is any natural number, and can depend strongly on the skill-set of the layout engineer. These iterations affect the design cycle and non-recurrent cost of the chip. In addition, manual processes are often error prone, which further affects the design cycle and cost. In [Wang-2006], a new design flow for RFIC is presented that accounts for parasitic effects only.

In Jinho Park, Kiyong Choi, and D. J. Allstot, "Parasitic-aware RF circuit design and optimization", IEEE Transactions on Circuits and Systems I, Volume: 51, Issue: 10, 2004, Page(s): 1953-1966 [Park-2004], which is also incorporated by reference, a parasitic-aware RF IC design and optimization methodology is presented that uses particle swarm optimization and simulated annealing. In Kiyong Choi and D. J. Allstot, "Parasitic-aware design and optimization of a CMOS RF power amplifier", IEEE Transactions on Circuits and Systems I, Volume: 53, Issue: 1, 2006, Page(s): 16-25 [Choi-2006], which is also incorporated by reference, the methodology presented also included parasitic-aware design with simulated annealing optimization, and PVT simulation using standard Monte Carlo modeling. Existing circuit-level techniques such as in K. Kwok and C. H. Luong, "Ultra-Low-Voltage High-Performance CMOS VCOs using Transformer Feedback," IEEE Journal of Solid State Circuits, vol. 40, no. 3, pp. 652-660, 2005 [Kwok-2005], which is also incorporated by reference, address parasitic or process-variations, however do not consider all challenges posed by nanoscale CMOS, i.e. P4VT or methods applicable to generic AMS-SoC components. As evident from the existing mixed-signal modeling, synthesis and optimization research, such as P. Yun, G. Ning, and D. Zaiwang, "Mixed-Signal Modeling and Analysis for a Digital RF Direct Sampling Mixer", in Proceedings of the 4th IEEE International Conference on Circuits and Systems for Communications, 2008, pp. 623-627 [Yun-2008] and A. Doboli and R. Vemuri, "Exploration-Based High-Level Synthesis of Linear Analog Systems Operating at Low/Medium Frequencies," IEEE Transactions on CAD of Integrated Circuits, vol. 22, no. 11, pp. 1556-1568, 2003 [Doboli-2003], which are both incorporated by reference, there is no methodology available for P4VT-aware AMS-SoC and the existing approaches are not adequate to take on the challenges of nanoscale and gigascale integration. For digital circuits, various system-level or architectural-level techniques are proposed in T. Chantem, X. S. Hu, and R. P. Dick, "Temperature-Aware Scheduling and Assignment for Hard Real-Time Applications on MPSoCs," IEEE Transactions on Very Large Scale Integration (VLSI) Systems, Volume: 19, Issue: 10, 2011, Page(s): 1884-1897 [Chantem-2011] and S. Pasricha, Y.-H. Park, F. J. Kurdahi, and N. Dutt, "Incorporating PVT Variations in System-level Power Exploration of On Chip Communication Architectures," in Proceedings of the International Conference on VLSI Design, 2008, pp. 363-370 [Pasricha-2008], which are also incorporated by reference. These techniques individually address power, variability, or temperature; however, none of them handle P4VT and none of these techniques are proposed for AMS-SoC.

Many common approaches use macromodeling to reduce the complexity of the system under study. In A. Agarwal, G. Wolfe, and R. Vemuri, "Accuracy driven performance macromodeling of feasible regions during synthesis of analog circuits", in Proc. Great Lakes Symp. VLSI, GLSVLSI, pages 482-487, 2005 [Agarwal-2005], which is incorporated by reference, an accuracy driven macromodeling approach is proposed for synthesis of analog circuits. In M. Ding and R. Vemuri, "Efficient analog performance macromodeling via sequential design space decomposition", in Proc. Int. Conf. VLSI Des., pages 553-556, 2006 [Ding-2006], which is hereby incorporated by reference, a sequential design space decomposition technique is presented for efficient analog macromodeling. Macromodels are reduced complexity models but rely on the same type of modeling and simulator as the original models (e.g., SPICE). In the metamodeling approach, the underlying system is completely decoupled from the simulator and the resulting metamodel (i.e., model of a model) is more general, flexible and easier to simulate and optimize than a macromodel.

A few existing research works deal specifically with metamodeling, but these are primarily polynomial metamodels, and not for mixed-signal circuits or systems. In J. L. Wong, A. Davoodi, A. Khanderwal, A. Srivastava, and M. M. Potkonjak, "A Statistical Methodology for Wire-Length Prediction", IEEE Transactions on Computer-Aided Design of Integrated Circuits and Systems, 25(7):1327-1336, July 2006 [Wong-2006], which is hereby incorporated by reference, a surrogate modeling approach is used for statistical wire-length estimation. In A. Sangiovanni-Vincentelli, G. Yang, S. K. Shukla, D. A. Mathaikutty, and J. Sztipanovits, "Metamodeling: An Emerging Representation Paradigm for System-Level Design", IEEE Design & Test of Computers, May-June 2009, Volume: 26, Issue: 3, page(s): 54-69 [Vincentelli-2009], which is hereby incorporated by reference, Intellectual Property (IP) reuse for System-on-a-Chip (SoC) interaction and microprocessor design are presented for systems. In R. Samanta, J. Hu, and P. Li, "Discrete Buffer and Wire Sizing for Link-Based Non-Tree Clock Networks", *IEEE Transactions on Very Large Scale Integration (VLSI) Systems*, 18(7): 1025-1035, July 2010 [Samanta-2010], which is hereby incorporated by reference, surrogate modeling for expensive circuit-level simulation is proposed using support vector machine (SVM)-based machine learning.

Behavioral simulation of analog and mixed-signal systems has been extensively researched. In Q. Jing, T. Riad, and S. Chan, "Characterizing PLL jitter from power supply fluctuation using mixed-signal simulations, in *Proc. 2nd Asia Symp. Quality Electronic Design (ASQED)*, pages 112-117, 2010 [Jing-2010], which is hereby incorporated by reference, Verilog-A behavioral modules of linear VCOs are used for fast jitter characterization. In I. Harasymiv, M. Dietrich, and U. Knochel, Fast mixed-mode PLL simulation using behavioral baseband models of voltage-controlled oscillators and frequency dividers, in *Proc. XIth Int Symbolic and Numerical Methods, Modeling and Applications to Circuit Design (SM2ACD) Workshop*, pages 1-6, 2010 [Harasymiv-2010], which is hereby incorporated by reference, Verilog-A modules and look-up-table are used for the behavioral simulation of VCOs. In S. Pam, A. K. Bhattacharya, and S. Mukhopadhyay, "An efficient method for bottom-up extraction of analog behavioral model parameters", in *Proc. 23rd Int. Conf. VLSI Design VLSID '10*, pages 363-368, 2010 [Pam-2010], which is hereby incorporated by reference, an event-driven efficient analog modeling approach is proposed that uses the Verilog-AMS real data type.

In U.S. Pat. No. 7,251,795, "Connecting verilog-AMS and VHDL-AMS components in a mixed-language mixed", to Prasenjit Biswas et al., [Biswas-2006], which is hereby incorporated by reference, a method is proposed to simultaneously use Verilog-AMS and VHDL-AMS for mixed-signal design. In U.S. Pat. No. 6,637,018, "Mixed signal synthesis behavioral models and use in circuit design optimization", to Michael J. Demler [Demler-2003], a system is proposed for synthesis of analog and mixed-signal circuits. In U.S. Pat. No. 7,086,020, "Circuits and methods for matching device characteristics for analog and mixed-signal designs," to Howard Hao Chen et al. [Chen-2006], methods are proposed for matching of characteristics of analog and mixed-signal circuits. In U.S. Pat. No. 7,304,544, "Automatic phase lock loop design using geometric programming", to David M. Colleran et al., a method is proposed for automatic PLL design using geometric programming.

FIG. 1 is a diagram of a modeling architecture in accordance with an exemplary embodiment of the present disclosure. Electronic devices are used in military and consumer applications (such as mobile phones, optical/magnetic storage systems, and health monitoring systems) and can include diverse analog and digital subsystems and their interfaces on a single board or die. Analog/Mixed-Signal Systems-On-Chip (AMS-SoCs, also called mixed-signal systems) can be used where analog and digital integrated circuit (IC) components are combined together for cost-performance tradeoffs. Analog circuits are absolutely necessary in these systems, such as to provide interface elements, even when the functions are being performed by digital processors. In addition, other essential circuits such as analog to digital converters (ADCs), digital to analog converters (DACs), and phase-locked loops (PLLs) are intrinsically mixed-signal circuits or subsystems. Present day mixed-signal circuits and systems are of gigascale complexity and consist of nanoscale features with significant undesired parasitic elements. For large, complex, and nanoscale mixed-signal systems various issues can be addressed using the present disclosure, such as how fast design space exploration can be performed at high levels of design abstraction, how complex circuits can be simulated in a reasonable time given stringent time-to-market constraints, how fast physical design (layout generation) and optimization can be performed, and how nanoscale process variations and thermal effects can be accounted for during the design flow.

Design constraints, such as the competitive time to market, discourage the use of a slow exhaustive design space exploration to reach fully optimal performance for the commercial implementation of a complex circuit. At the same time, accurate circuit level, full-blown parasitic netlist-based design optimization (e.g. where lists of devices are used and connectivity for such devices is identified) may be difficult to deal with for current nanoscale high-density complex circuits. For example, the simulation time for a phase-locked loop (PLL) lock on a full parasitic netlist can be on the order of many days to weeks. In the "conventional" iterative approach, if the post-layout specifications are not met, logic modification is made using transistor sizing. This is a time consuming and error prone approach (which reduces yield) and also requires repeated layout changes (which increases the design cycle time and cost). Optimization at this level is intensive and even infeasible as it is hard to predict the output of a circuit, due to the computational complexity of simulation.

FIG. 2 is a diagram showing design requirements that are correctly modeled during the design process in accordance with an exemplary embodiment of the present disclosure. When mixed-signal systems are fabricated using nanoscale technology, the circuits used to implement such systems can be strongly impacted by the imperfections of manufacturing processes, such as those caused by sub-wavelength lithography and chemical-mechanical polishing. Each of the transistors in a mixed-signal system (in a die, different dies, different wafers, or different lots) is different due to changes in dimensions, impurity levels, or surface charge. However, design decisions are often based on nominal values (rather than statistical estimates) of circuit attributes, under the assumption that all transistors are alike. However, design decisions based on nominal data are not correct, because the data are either overestimations or underestimations of actual (silicon) data (i.e. design-to-silicon gap), which can lead to loss of yield in mixed-signal component circuits. Nanoscale mixed-signal systems need to perform under severe process variations, in the presence of dense interconnects with large parasitic elements, while satisfying strict performance and power requirements. Nanoscale mixed-signal systems may also need to be tolerant of voltage fluctuations and typically operate under a range of environmental and on-chip temperatures.

Efficient mixed-signal design exploration can be achieved by one or more of the following approaches: reduction of simulation time, reduction of optimization time, and reduction of the number of manual layout steps needed. Transistor (schematic) and layout (physical design) design exploration can be performed at the layout level only. In this route, the layout of the baseline schematic is created and is subsequently optimized. Optimization can also be performed for both schematic and physical designs. In this route, a baseline schematic is first optimized, then a layout of the schematic-optimal design is performed. The schematic-optimal layout is then optimized at the layout level. Out of these two, the second route may be faster, as layout-optimization (which is more complex than schematic-optimization due to the presence of parasitics) is performed over a schematic-optimal layout design. In accordance with the present disclosure, the following five exemplary alternative design methodologies are described for ultra-fast mixed-signal design space exploration:
1) A methodology using automatic layout-netlist optimization.
2) A methodology using automatic combined schematic-netlist and layout-netlist optimization.
3) A methodology using automatic layout-netlist-metamodel optimization.
4) A methodology using automatic combined schematic-netlist-metamodel and layout-netlist-metamodel optimization.
5) A methodology for unified mixed-signal architecture-level design exploration.

Figure 3:
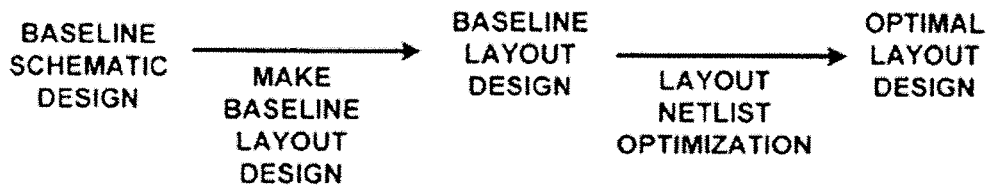
FIG. 3 is an overview of a methodology that utilizes automatic layout-netlist optimization in accordance with an exemplary embodiment of the present disclosure.

FIG. 3 is an overview of a methodology 300 that utilizes automatic layout-netlist optimization in accordance with an exemplary embodiment of the present disclosure. In this methodology, a baseline schematic design is first performed. The baseline layout is then manually constructed. The baseline-layout netlist which contains parasitics (resistors-R, capacitors-C, self-inductance-L, and mutual-inductance-K) and transistors is statistically optimized using algorithms that take into account process variability. The layout is then manually modified to obtain the optimal layout of a mixed-signal component, resulting in only two manual layout steps.

Figure 4:
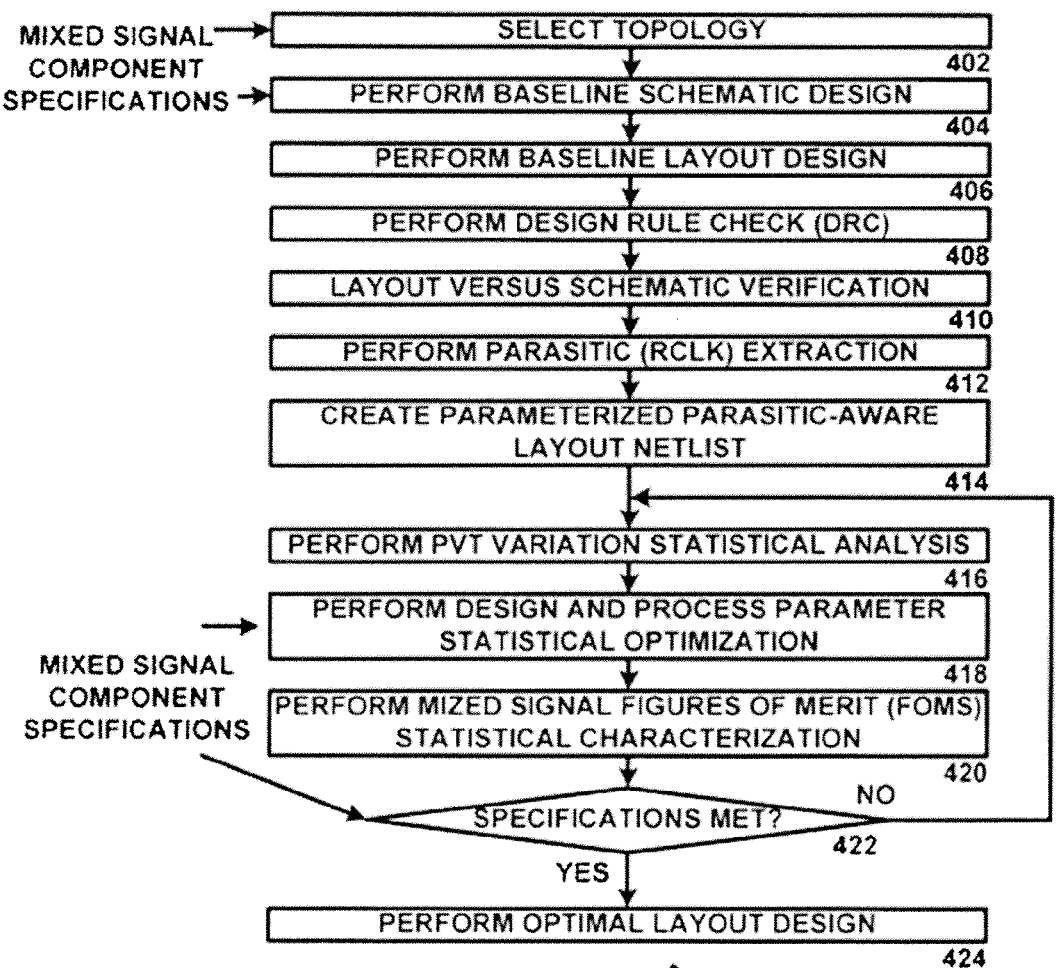
FIG. 4 is a diagram of an algorithm for implementing a methodology in accordance with an exemplary embodiment of the present disclosure.

FIG. 4 is a diagram of an algorithm 400 for implementing methodology 300 in accordance with an exemplary embodiment of the present disclosure. Algorithm 400 can be implemented in hardware or a suitable combination of hardware and software, such as one or more software systems operating on a processor.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

Figure 5:
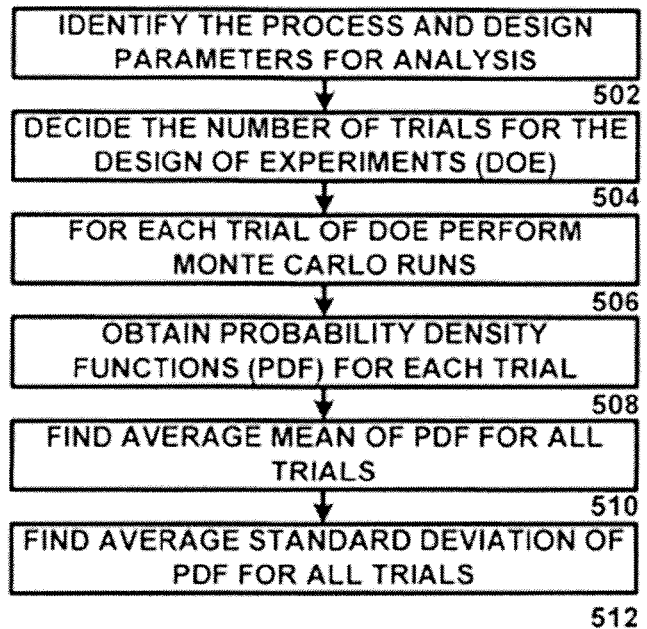
FIG. 5 is a diagram of an algorithm for implementing a methodology in accordance with an exemplary embodiment of the present disclosure.

In this exemplary embodiment of the design methodology, once the topology is selected at 402, the algorithm proceeds to 404 where the baseline schematic design is performed. The algorithm then proceeds to 406 where a baseline layout design is prepared. The algorithm then proceeds to 408 where the layout design is analyzed using a design rule check (DRC), and the algorithm then proceeds to 410 where the layout design is analyzed using a layout versus schematic (LVS) analysis. The algorithm then proceeds to 412 where a parasitic resistance (R), capacitance (C), self-inductance (L) and mutual inductance (K) (RCLK) extraction for the interconnect is performed. Parasitic elements for the active devices, which are geometry (layout) dependent, are also extracted from the layout during this process and the relevant parameters are passed to the technology models. The algorithm then proceeds to 414 where a parasitic-aware layout-netlist is created which is parameterized for design and process parameters, and a worst-case or average process, voltage, and temperature (PVT) variation statistical analysis of the physical design is performed using the parameterized parasitic-aware layout-netlist. Traditional Monte Carlo (TMC) simulations or other suitable simulations can be used for this statistical analysis. For example, a 1000 Monte Carlo run over an 180 nm CMOS PLL with a full-blown parasitics analysis can take 5 days even on a high-end server. A new method called Design-Of-Experiments assisted Monte Carlo (DOE-MC) can be for tradeoff of accuracy, as shown in the diagram of algorithm 500 in FIG. 5. In the DOE-MC approach, a very small number of Monte Carlo runs are used for each trial of DOE. At 502, for n number of process parameters, with each parameter varying between two extreme values (a high and a low), a factorial design has $2^n$ trials (i.e. for 3 parameters 8 trials), which is determined at 504. Each trial corresponds to a corner in the design space. After the Monte Carlo runs are performed at 506, the $i=2^n$ intermediate probability density functions $PDF_i(\mu_i, \sigma_i)$ are obtained at 508, each characterized by a mean ($\mu_i$) and standard deviation ($\sigma_i$). The overall PDF of the target figure-of-merit (FoM) is calculated as the average of the intermediate PDFs over all corners. In other words, using the statistical average approach i.e. $PDF_{FoM}(\mu_{FoM}, \sigma_{FoM})$=Statitical-Average-over-$2^n$($PDF_i(\mu_i, \sigma_i)$). For simplicity, this can be calculated as follows: $\mu_{FoM}$ is the average of $\mu_i$s and $\sigma_{FoM}$ is the average of $\sigma_i$s. It should be noted that the standard deviations do not add quadratically, as is the case of uncorrelated PDFs.

The parameterized parasitic-aware layout-netlist is subjected to different algorithms for statistical optimization under worst-case or average variations. Optimization using the layout-netlist can be prohibitively slow. For convergence to a design solution a two-level optimization approach is utilized. In this optimization approach, a global search is performed using a memetic optimization algorithm and a local search is performed using an artificial bee colony algorithm. In a statistical optimization, an increase in μ translates to loss of yield (i.e. not meeting the specifications) and increase in σ translates to higher variability (also results in loss of yield and poor quality). Four cases can be considered:
high-μ and high-σ (case-1)
low-μ and low-σ (case-2)
low-μ and high-σ (case-3)
high-μ and low-σ (case-4)

The baseline case is case-1. The optimal and high-yield which is the desired solution is case-2. A target optimal and low-yield solution is case-3. A possible optimization result with low variability and acceptable mean is case-4. Two ways to quantify a PDF for comparison in optimization are: (1) as a weighted sum of mean (μ) and variance (σ); i.e., (α×μ+β×σ), where α and β are scalars under the control of the designer or (2) as a ratio of mean to standard deviation, |μ/σ|.

At 418, the layout-level statistical characterization is performed over the layout-netlist using updated design parameters from the optimization stage. If it is determined that the parameter values for which the specifications have been provided have not been met at 422, the algorithm returns to 416. Once the parameter values for which the specifications are met are obtained, an optimal layout of the mixed-signal component is created at 424 using these parameter values. This methodology can utilize two manual layout steps and M automatic iterations over the baseline-layout netlist.

This exemplary methodology provides for physical design of nanoscale mixed-signal system components to meet required design specifications. In this algorithm, a single design iteration approach is followed, in which the layout is performed only twice—once before the optimization, and once with modifications, after the optimization. Furthermore, the second layout stage is only an incremental adjustment to the original layout and typically incurs little area and design time overhead. The elimination of manual steps is very significant for the reduction of design cycle time and non-recurrent cost. In addition to reducing the need of highly skilled personnel to undertake this kind of design, it also reduces the likelihood of layout errors that manual steps would more easily generate. Thus, the disclosed algorithm can handle large and complex mixed-signal designs in reasonable time with minimal resource usage. The fully extracted physical design is optimized to concurrently meet the target specification of the various FoMs such as oscillation frequency, power dissipation, and phase-noise.

Figure 6:
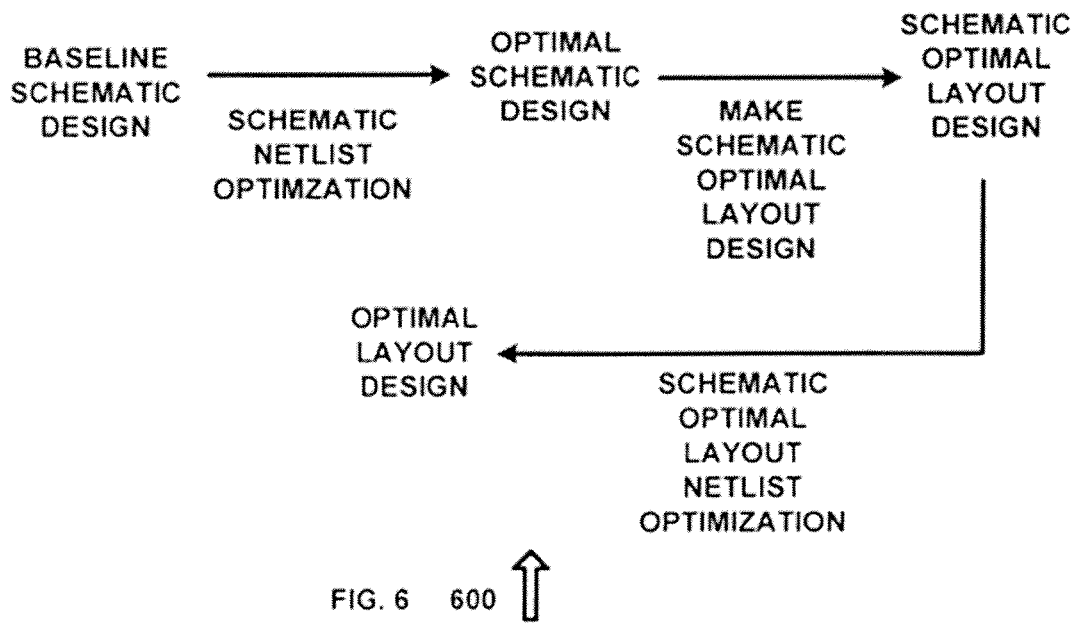
FIG. 6 is a diagram of a methodology that uses both schematic-netlist optimization and layout-netlist optimization in accordance with an exemplary embodiment of the present disclosure.

FIG. 6 is a diagram of a methodology 600 that uses both schematic-netlist optimization and layout-netlist optimization in accordance with an exemplary embodiment of the present disclosure. In this methodology, a baseline schematic design is first performed. The baseline schematic is then analyzed statistically for FoMs. This is in contrast to methodology 300, where the process proceeds immediately to the layout without a statistical analysis of the schematic-netlist. The schematic-netlist is statistically optimized to obtain an optimal schematic of the mixed-signal components. The layout of the schematic-optimal design is then designed. From the schematic-optimal layout a layout-netlist containing RCLK parasitics and transistors is obtained. This layout-netlist is then optimized statistically using predetermined algorithms. Based on the design parameters obtained from the optimization algorithms, the optimal-layout design is performed.

Figure 7A:
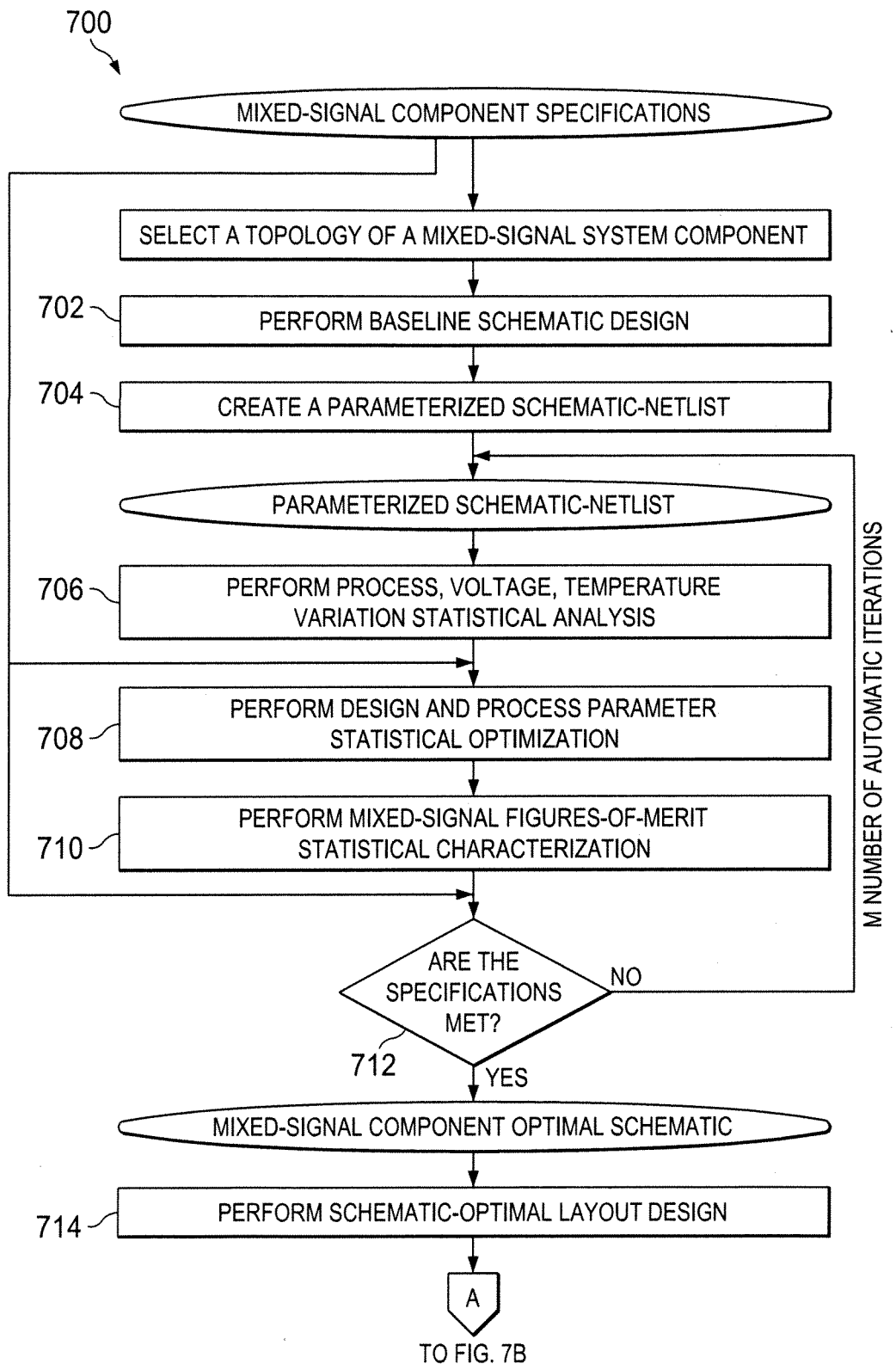
FIGS. 7A and 7B are diagrams of an algorithm that uses both schematic-netlist and layout-netlist automatic optimizations in accordance with an exemplary embodiment of the present disclosure.
Figure 7B:
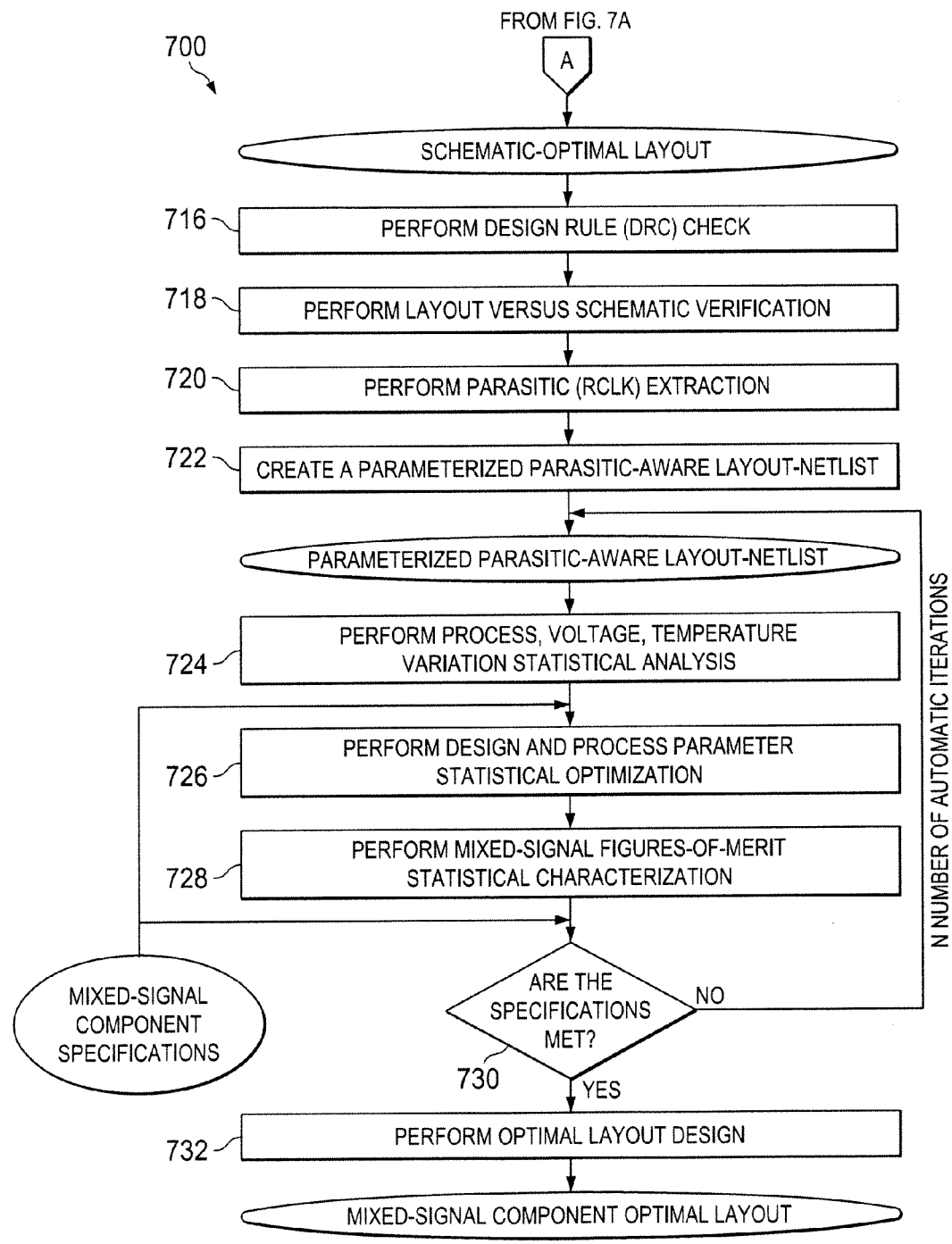

FIGS. 7A and 7B are diagrams of an algorithm 700 that uses both schematic-netlist and layout-netlist automatic optimizations in accordance with an exemplary embodiment of the present disclosure. In algorithm 700, the baseline schematic design of a mixed-signal component is performed at 702. A schematic-netlist is created at 704 that is parameterized for the design parameters. The parameterized schematic-netlist is relatively simple as it does not contain the parasitics. However, it can have a large number of design parameters which depend on the FoM of mixed-signal components and the number of design parameters. At 706, statistical analysis of the schematic-netlist is performed for the target FoMs, such as by using Latin Hypercube Sampling (LHS) and fit statistical distributions (e.g. Gaussian) to obtain the probability density function of a given FoM $PDF_{FoM}$, or in other suitable manners. The algorithm then proceeds to 708 where the schematic-netlist is optimized using suitable algorithms to obtain the optimal-schematic of the mixed-signal components. In one exemplary embodiment, a particle swarm optimization (PSO) can be used for optimization, which can use M iterations if it is determined that the specifications are not met at 712. At 710, the schematic-level statistical characterization is performed over the schematic-netlist using updated design parameters from the optimization step.

At 714, a layout of the schematic-optimal design is performed and it is called schematic-optimal layout. The algorithm then proceeds to 716 where the layout design is subjected to Design Rule Check (DRC). At 718, an LVS analysis is performed on the layout design, and the algorithm proceeds to 720 where an RCLK extraction is performed. At 722, a layout-netlist is extracted from the schematic-optimal layout which contains RCLK parasitics and transistors. Parasitic elements for the active devices, which are geometry (layout) dependent, are also extracted from the layout during this process and the relevant parameters are passed to the technology models. The layout-netlist is parameterized to obtain a parameterized parasitic-aware layout-netlist. The algorithm then proceeds to 724 where a worst-case or average process, voltage, and temperature variation statistical analysis of the physical design is performed using the parameterized parasitic-aware layout-netlist, such as by using DOE-MC or other suitable processes. The parameterized parasitic-aware layout-netlist is subjected to suitable algorithms for statistical optimization under worst-case or average variations. A combined genetic and artificial bee colony algorithm can be used at this phase of the design flow for statistical optimization; the genetic-algorithm can be used for global searching and the artificial bee colony can be used for local searching. If it is determined at 730 that the specifications have not been met, N automatic iterations can be performed. At 728, a layout-level statistical characterization is performed over the layout-netlist using updated design parameters. Once the parameter values for which the specifications are met are obtained, an optimal layout-netlist is obtained. The algorithm then proceeds to 732, where a layout design is performed for the layout-optimal mixed-signal component design.

This methodology for physical design of nanoscale mixed-signal system components can be used to meet required design specifications using a two-step optimization. The two step optimization has M iterations over the schematic-netlist and N iterations over the layout-netlist. In this design flow, manual iterations can be used twice; a first time for the design of the schematic-optimal layout and a second time for design of the layout-optimal layout. Likewise, other suitable automated processes can also or alternatively be used. Furthermore, the second layout stage can be an incremental adjustment to the original layout so as to incur minimal area and design time overhead. The elimination of manual steps is very significant for design cycle time, non-recurrent cost, and overall chip cost, and reduces the need of highly skilled personnel to undertake this kind of design. Algorithm 700 also reduces the chance of layout errors that manual steps would more easily generate. Thus, algorithm 700 can be used for large and complex mixed-signal designs in reasonable time with minimal resource usage. The fully extracted physical design can be optimized to meet the target specifications of the various FoMs, such as oscillation frequency, power dissipation, and phase-noise. The increase in speed when compared to a traditional mixed-signal design approach comes from the two-step automatic iterations and two manual layout design steps. The layout-netlist optimization is faster and requires fewer iterations compared to the layout-optimization of algorithm 400, because the schematic-optimal layout is used instead of the baseline layout. The schematic-optimal layout is closer to the layout-optimal layout than the baseline-layout, thus resulting in faster convergence of the optimization loops.

Figure 8:
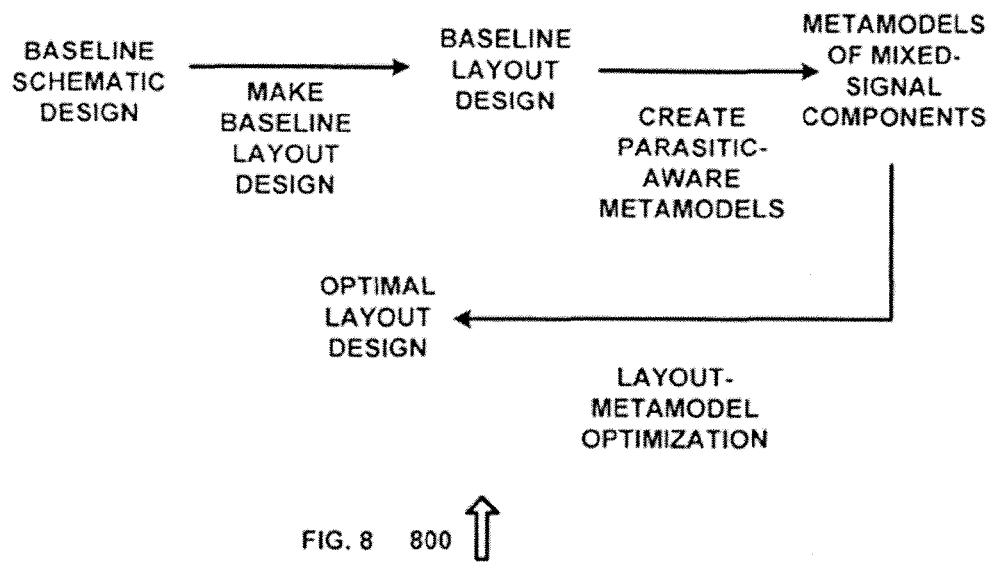
FIG. 8 is a diagram of a methodology that uses layout-metamodels as a medium for mixed-signal component optimization, in accordance with an exemplary embodiment of the present disclosure.

FIG. 8 is a diagram of a methodology 800 that uses layout-metamodels as a medium for mixed-signal component optimization, in accordance with an exemplary embodiment of the present disclosure. In methodology 800, a baseline schematic design is first performed. The baseline layout design of the mixed-signal component is then obtained. From the baseline layout, a layout-netlist containing RCLK parasitics and transistors is obtained. Up to this stage the flow presented in methodology 800 is similar to methodology 300. However, from this point on, the design is abstracted to a higher level of representation, called a metamodel. Given that the parasitic-aware netlists (the model of the design) are expensive to simulate and optimize using analog circuit simulators, they are abstracted to mathematical algorithms; in other words, to models of the original model, or metamodels. Metamodels are generated using the baseline layout-netlist and are called layout-metamodels. Mixed-signal component optimization is performed using suitable algorithms, over the layout-metamodels. Based on the design parameters obtained from the optimization algorithms, the optimal-layout design is then performed. The optimization over metamodels speeds up the design process tremendously (up to thousands of times) as compared to optimization over netlists.

Figure 9:
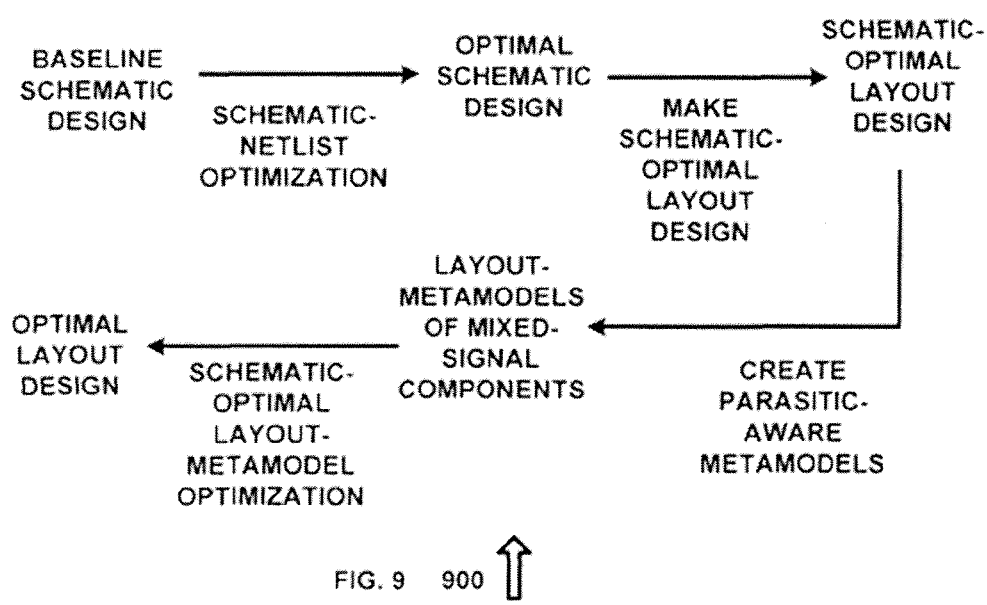
FIG. 9 is a diagram of a methodology that uses schematic-netlist and layout-metamodels as the medium for mixed-signal component optimization in accordance with an exemplary embodiment of the present disclosure.

FIG. 9 is a diagram of a methodology 900 that uses schematic-netlist and layout-metamodels as the media for mixed-signal component optimization in accordance with an exemplary embodiment of the present disclosure. In methodology 900, a baseline schematic design is first performed. The baseline schematic is then analyzed statistically for FoMs. The schematic-netlist is statistically optimized to obtain an optimal-schematic of the mixed-signal components. The layout of the schematic-optimal design is then constructed. From the schematic-optimal layout, a layout-netlist containing RCLK parasitics and transistors is obtained. At this point, parasitic-aware metamodels are created for the mixed-signal components for different FoMs. These schematic-optimal-layout-metamodels are then concurrently optimized statistically using suitable algorithms. Based on the design parameters obtained from the optimization algorithms, the optimal-layout design is performed.

Figure 10:
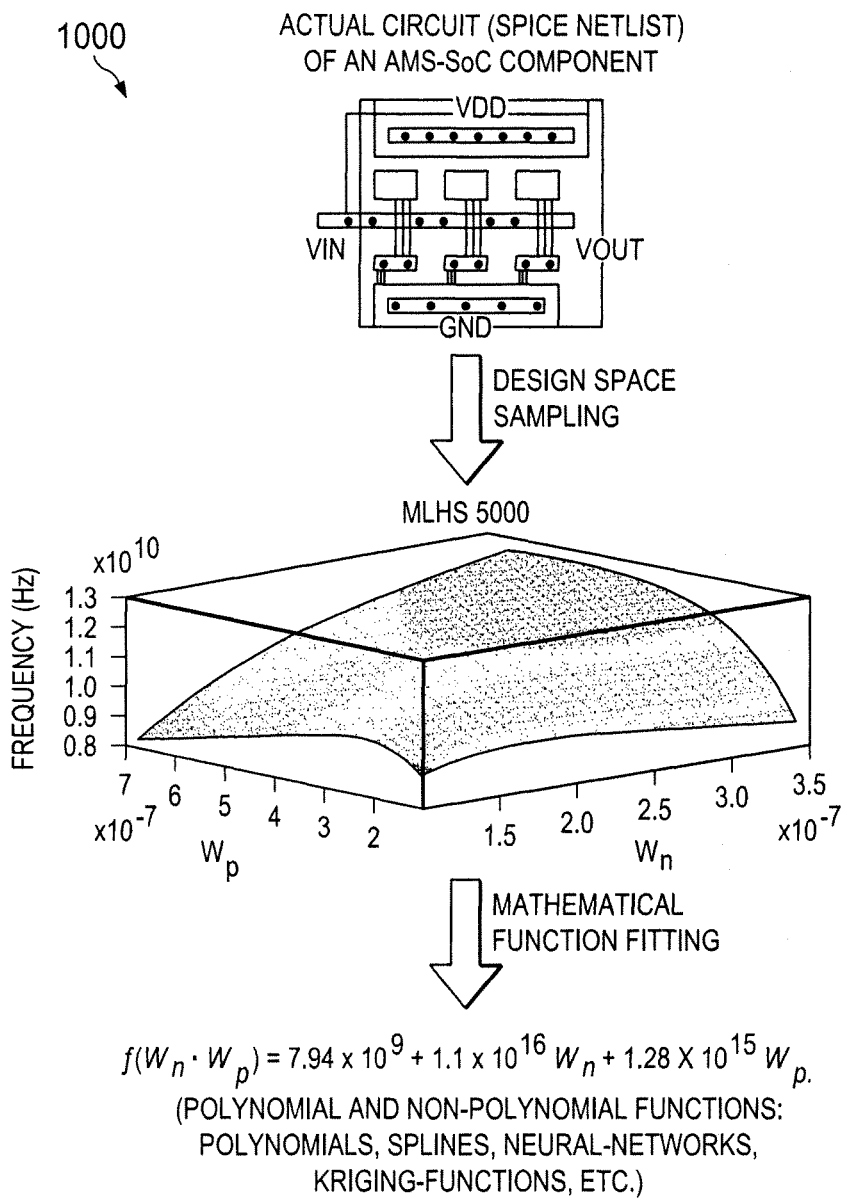
FIG. 10 is a diagram showing metamodels as mathematical algorithms or functions, in accordance with an exemplary embodiment of the present disclosure.

FIG. 10 is a diagram 1000 showing metamodels as mathematical algorithms or functions, in accordance with an exemplary embodiment of the present disclosure. The metamodel can be a language- and simulator-independent model of the original model (hence the term meta). Metamodels can also be mathematical representations of FOMs in terms of circuit design parameters. They are based on prediction equations or algorithms. The terms "metamodel" and "macromodel" are used in the relevant literature interchangeably but they are very distinct. A macromodel is simply a reduced complexity (order) representation of the circuit but is still a netlist, necessitating the use of an analog (SPICE) simulator. Metamodels can be polynomial or non-polynomial in nature. There are various types of metamodels, including the following: polynomial metamodels, spline metamodels (piecewise-polynomial or local polynomial metamodels), neural-network metamodels, Kriging metamodels, and Bayesian metamodels. Several techniques and algorithms for fast and efficient sampling of the design space and subsequent generation of comprehensive metamodels of mixed-signal components with accurate parasitics, parametric correlations, and process variability estimates are needed. Specifically, a class of model generation and fitting technique, called Kriging, is well suited for mixed-signal circuit and system modeling. Kriging methods can produce metamodels (aka surrogate models) of the mixed-signal systems accounting for nanoscale effects, such as full-blown parasitics and parametric correlations. Kriging methods were originally proposed in the early 1950's by Daniel Krige for use in geostatistical methods. The fundamental idea behind Kriging is that the predicted outputs are weighted averages of sampled data. The weights are unique to each predicted point and are a function of the distance between the point to be predicted and observed points. The weights are chosen so that the prediction variance is minimized. Kriging can be applied to data that contain intrinsic stochasticity globally but are rather continuous and deterministic locally, as in the distribution of mineral ores in a terrain, for example. If the physical cause of process variation in semiconductor manufacturing is considered, then a very similar mechanism is recognized. For example, the distribution of oxide thicknesses across a wafer is not completely random; rather, it resembles very closely topographical distributions of the type for which Kriging was originally developed.

Figure 11:
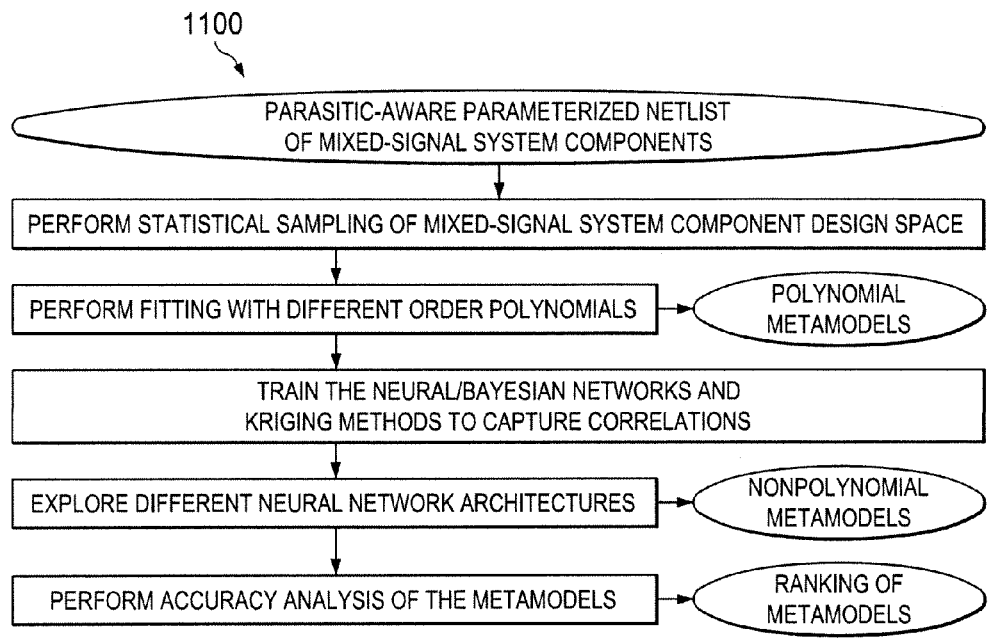
FIG. 11 is a diagram of an algorithm for either polynomial (including piecewise polynomial) or non-polynomial metamodel generation, in accordance with an exemplary embodiment of the present disclosure.

FIG. 11 is a diagram of an algorithm 1100 for either polynomial (including piecewise polynomial) or non-polynomial metamodel generation, in accordance with an exemplary embodiment of the present disclosure. The starting point is a netlist representation of the mixed-signal system components being modeled. The netlist is derived from the physical design of the mixed-signal system components and is parameterized with respect to design variables, such as device sizes and process parameters, threshold voltages, dielectric oxide thicknesses, channel concentrations, or other suitable design variables. The netlist is silicon accurate because it is derived from the layout of the component and includes full parasitics RCLK of the active and passive devices as well as the interconnects.

Efficient mixed-signal system component design space sampling can be used for accurate metamodel generation. The netlist parameterization allows concurrent exploration of the design space along with process (and implicitly voltage and temperature) variability awareness. Sufficient coverage of the design space for a large parameter set, whether it is design or process specific, or both, is a non-deterministic polynomial-time (NP-hard) problem. One commonly used approach to such problems is to sample the space randomly via traditional Monte Carlo sampling. A computational budget is typically allocated in terms of N simulation runs and the space is covered by N samples at which data are generated for the desired performance metrics of the mixed-signal system components. Since random allocation (Monte Carlo) of these N runs is easy and well understood, this method is a common approach used in the industry and for research. There are two serious disadvantages to this technique, though: (1) remote points in the space might not receive sufficient coverage, and (2) any estimate for variability obtained from the simulation data is global as each point contributes equally to the statistical sample. Global variability estimates are not adequate for yield prediction and robust design; instead, local estimates of variability with known dependence on design and process variables are needed.

Figure 12:
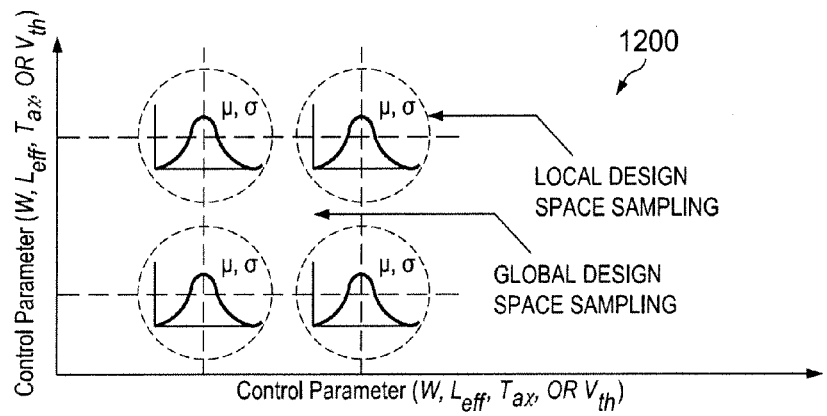
FIG. 12 is a diagram of a two-level hybrid sampling methodology for addressing design issues.

FIG. 12 is a diagram of a two-level hybrid sampling methodology 1200 for addressing these two issues. A combination of two of the following sampling techniques (1) Latin hyper-cube sampling, (2) Design of Experiments (DOE), (3) cluster sampling and (4) stratified sampling can be used for mixed-signal design space sampling.

Figure 13:
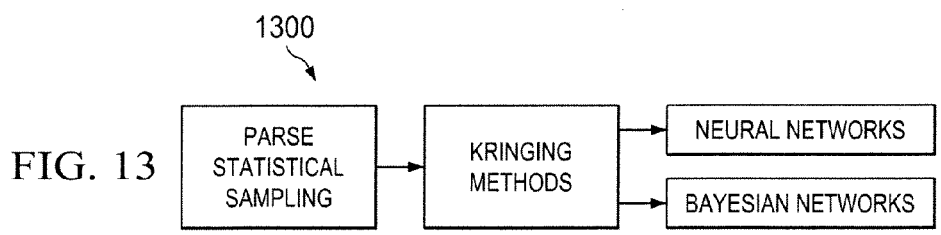
FIG. 13 is a diagram of a process for training of neural networks and Bayesian networks using Kriging methods in accordance with an exemplary embodiment of the present disclosure.

FIG. 13 is a diagram of a process 1300 for training of neural networks and Bayesian networks using Kriging methods in accordance with an exemplary embodiment of the present disclosure. Neural network metamodels are composed of a mass of fairly simple computational elements with rich interconnections between the elements. Neural networks operate in a parallel and distributed fashion which may resemble biological neural networks. Most neural networks have some sort of "training" rule by which the weights of connections are adjusted on the basis of presented patterns. Kriging methods, which themselves are metamodels, are used to train Neural networks and Bayesian networks.

Figure 14A:
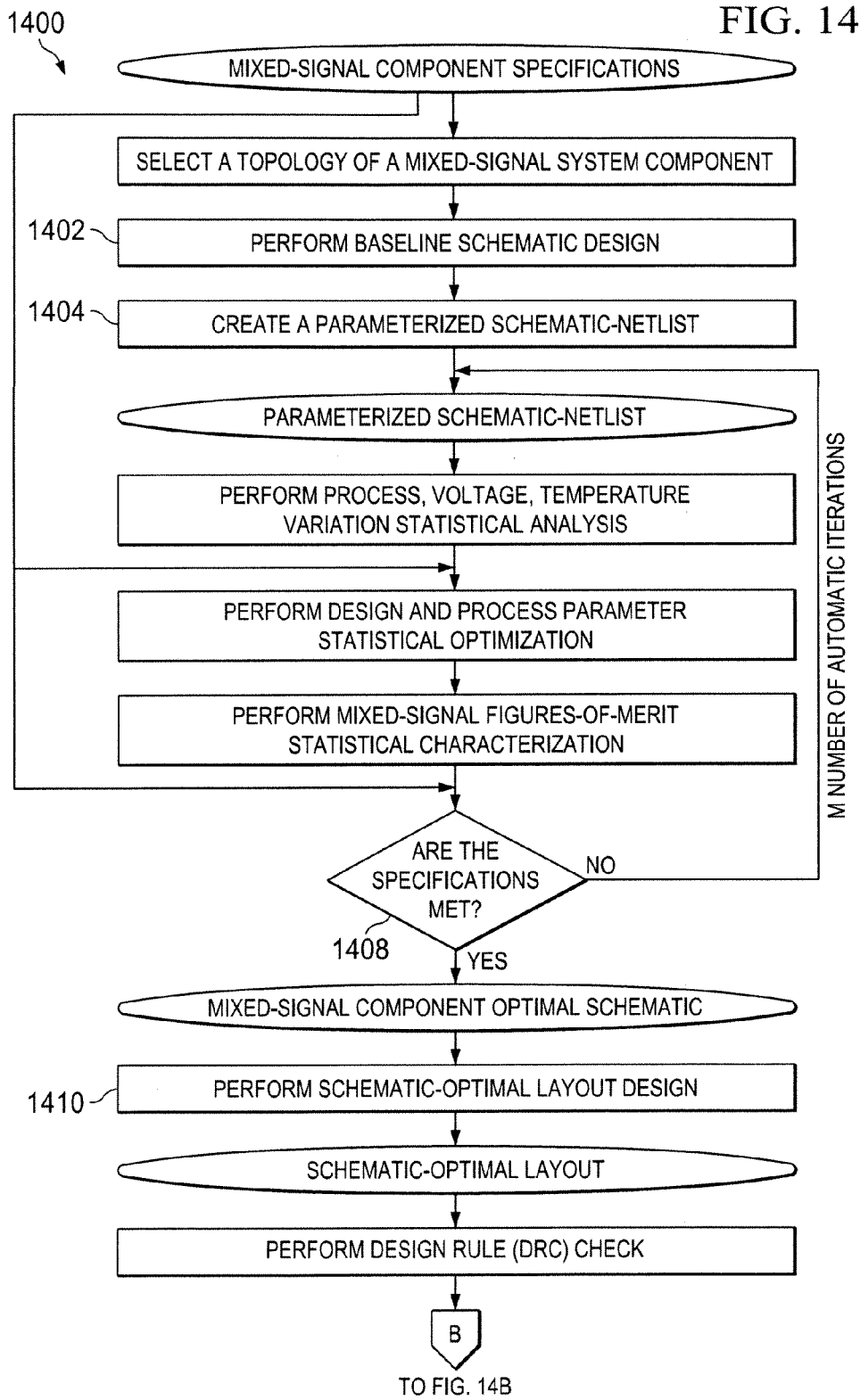
FIGS. 14A and 14B are diagrams of an algorithm that uses the layout-metamodel automatic optimization, in accordance with an exemplary embodiment of the present disclosure.
Figure 14B:
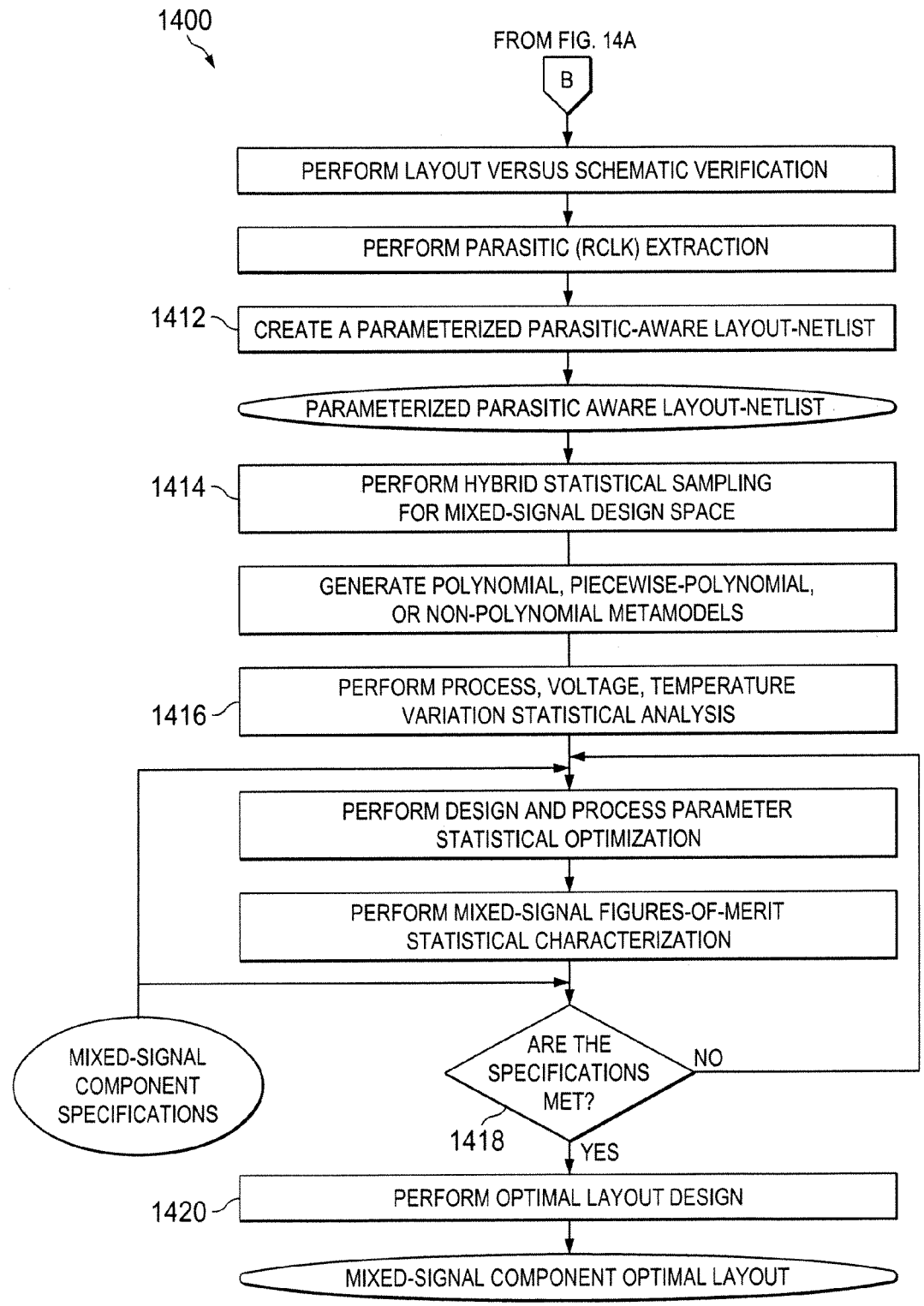

FIGS. 14A and 14B are diagrams of an algorithm 1400 that uses the layout-metamodel automatic optimization, in accordance with an exemplary embodiment of the present disclosure. Algorithm 1400 begins at 1402, where a baseline schematic design of a mixed-signal component is performed. The algorithm then proceeds to 1404, where a schematic-netlist is created that is parameterized for the design parameters. The parameterized schematic-netlist can be simple as it does not contain parasitics. However, it can have a large number of design parameters which depend on the FoM of mixed-signal components and number of design parameters. The algorithm then proceeds to 1406, where statistical analysis of the schematic-netlist is performed for the target FoMs. Then the schematic-netlist is optimized using suitable algorithms to obtain the optimal-schematic of the mixed-signal components in an iterative process ending at 1408, using M automatic iterations. The schematic-level statistical characterization is performed using the modified schematic-netlist using updated parameters. The number of iterations is "1" (i.e. M=1) if the methodology does not proceed with a schematic-netlist optimization; rather, it continues with a baseline schematic and baseline layout for the next steps of the methodology.

At 1410, layout of the schematic-optimal design (or baseline design if schematic is not optimized) is performed and it is called schematic-optimal layout (baseline layout). The layout design is then analyzed using DRC, LVS analysis and full-blown parasitic RCLK extraction is performed for the interconnect. From the layout, a layout-netlist is extracted at 1412 which contains RCLK parasitics and transistors. Parasitic elements for the active devices, which are geometry (layout) dependent, are also extracted from the layout during this process and the relevant parameters are passed to the technology models. The layout-netlist is parameterized to obtain a parameterized parasitic-aware layout-netlist. At 141, hybrid statistical sampling of the mixed-signal system design space is performed using the parameterized parasitic-aware layout-netlist applying the methodology presented in FIG. 12. At 1416, the statistical sampling polynomial, piecewise-polynomial, or non-polynomial metamodels are generated using the methodology presented in FIG. 11. A worst-case or average process, voltage, and temperature variation statistical analysis of the physical design is then performed using the layout-metamodels in an iterative process ending at 1418. The layout-metamodels can be subjected to suitable algorithms for statistical optimization under worst-case or average variations. This iterative process can be performed using K number of automatic iterations. The layout-level statistical characterization can be performed using the modified layout-netlist or from layout-metamodels using updated parameters. The algorithm results in parameter values for which the specifications are met. At 1420, a layout design is performed for the layout-metamodel-optimal mixed-signal component design.

Algorithm 1400 can be used for physical design of nanoscale mixed-signal system components to meet required design specifications using optimization over the layout-metamodels. The optimization has M iterations over schematic-netlist (which is 1 iteration if the methodology moves to the next steps without schematic optimization) and K iterations over the layout-metamodels. The automatic iterations needed in algorithm 1400 are substantially fewer than the iterations needed in other disclosed algorithms. In one exemplary embodiment, manual iterations can be used twice: first for the manual-design of the schematic-optimal (or baseline) layout, and a second time for the manual design of the layout-metamodel-optimal layout. The elimination of manual steps is very significant for design cycle time, non-recurrent cost, and overall chip cost, as it reduces the need of highly skilled personnel to undertake this kind of design, and also reduces the chance of layout errors that manual steps would more easily generate. Thus, algorithm 1400 can handle large and complex mixed-signal designs in reasonable time with minimal resource usage. The fully extracted physical design can be optimized to meet the target specification of the various FoMs such as power and frequency. The speedup compared to a traditional mixed-signal design approach comes from the two-step automatic iterations, only two manual layout design steps, and layout-metamodel optimization (instead of layout-netlist optimization). The layout-metamodel optimization is much faster and needs fewer iterations compared to the layout-netlist of the design methodology in FIGS. 7A and 7B.

Figure 15:
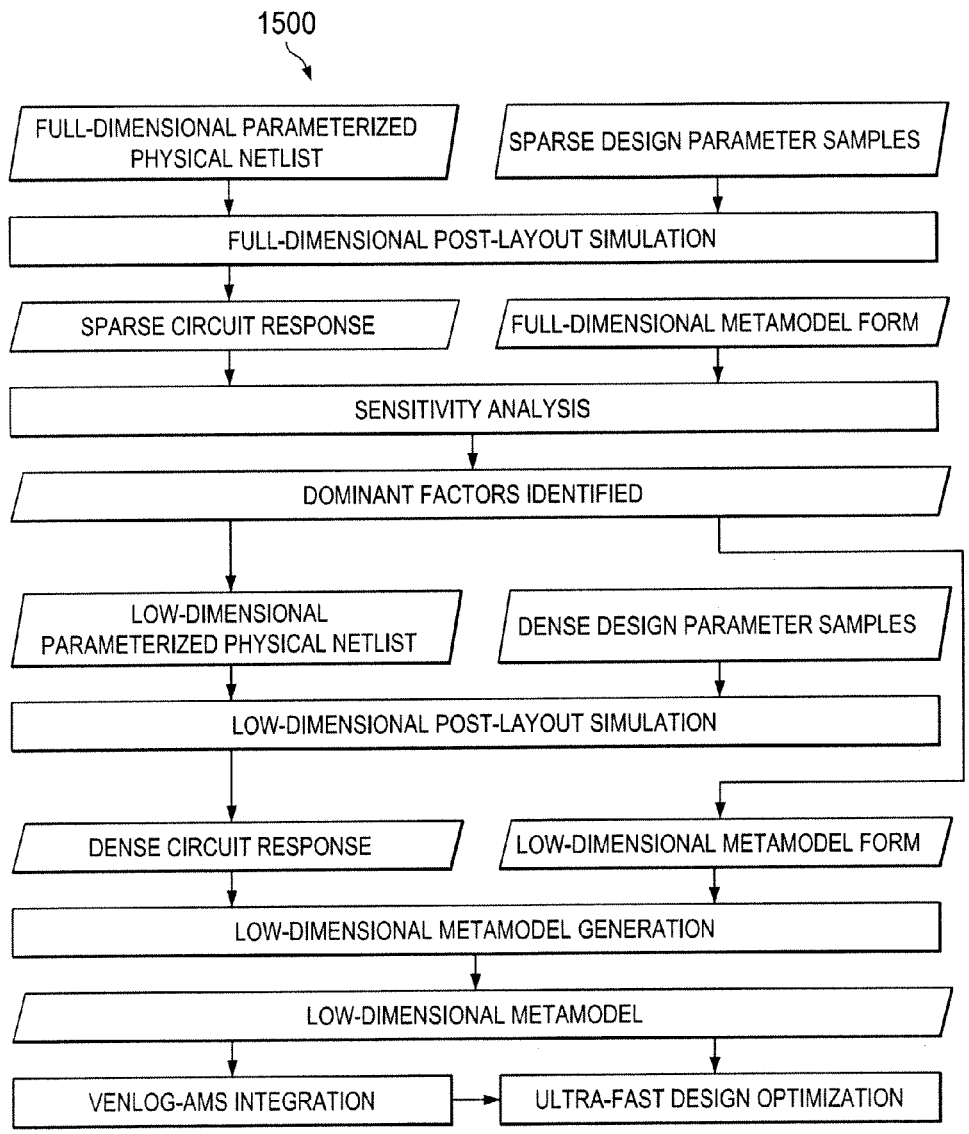
FIG. 15 is a diagram of a methodology that uses reduced-order-layout-metamodels, in accordance with an exemplary embodiment of the present disclosure.

FIG. 15 is a diagram of a methodology 1500 that uses reduced-order-layout-metamodels. In this methodology, the schematic-level design steps are the same as algorithm 1400. Using the same steps, the baseline-layout or schematic-optimal layout is obtained. From this layout, a parasitic-aware netlist is created which is called full-dimensional-parameterized-parasitic-aware netlist. This netlist contains the full-blown parasitics originating from the interconnect and transistors, and device geometry. From this full-dimensional parasitic-aware netlist, a sparse circuit response is obtained using statistical sampling of the mixed-signal system design space. Polynomial, piecewise-polynomial, or non-polynomial metamodels can then be generated using the metamodel generation methodology of FIG. 10, which are at this point called full-dimensional metamodels. Sensitivity analysis is then performed using the full-dimensional metamodels to identify which parameters are affecting which FoMs. The parameters which do not affect FoMs are not parameterized; instead, they are kept constant. The netlist at this point is revised to a low-dimensional-parameterized-parasitic-aware netlist. The netlist is now of lesser complexity and rigorous (dense) statistical sampling can be performed to obtain very accurate response data. From these sample points metamodels are generated again using the metamodel generation methodology in FIG. 11, which reduces the complexity of the metamodels, and which can be called low-dimensional metamodels which can be polynomial, piecewise-polynomial, or non-polynomial metamodels.

Figure 16:
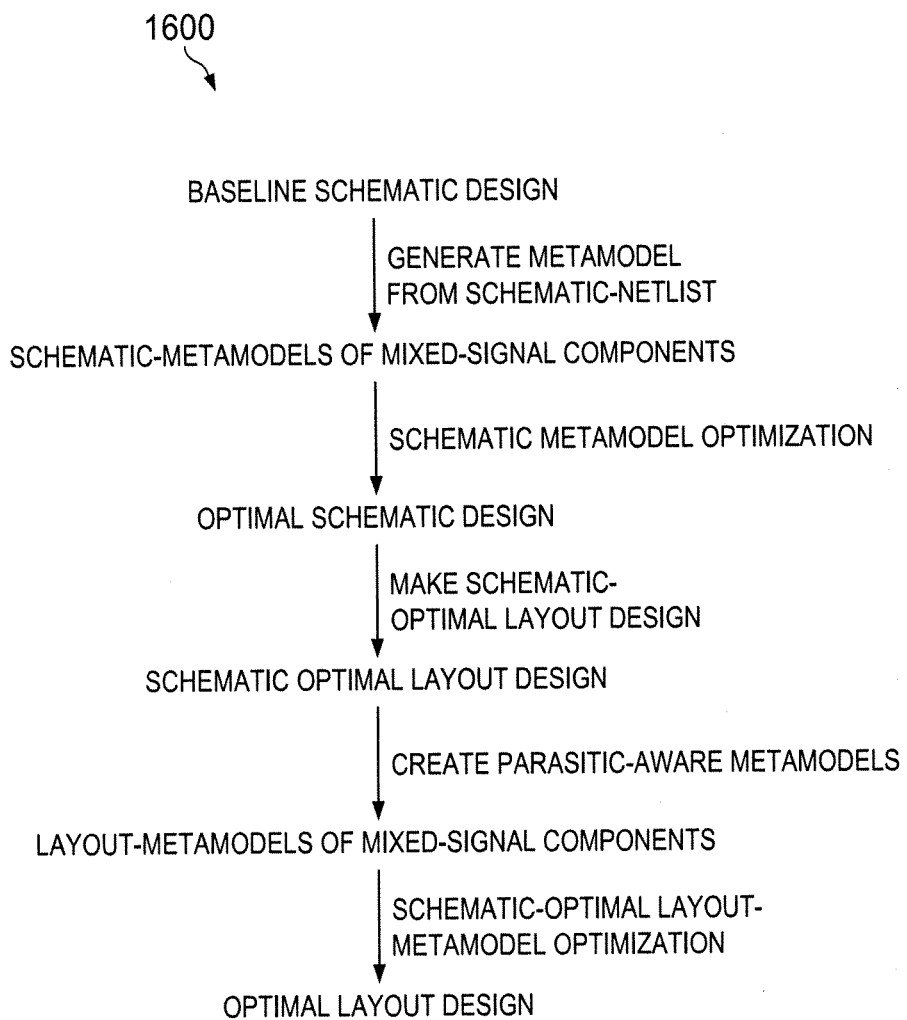
FIG. 16 is a diagram of a methodology that uses schematic-metamodels and layout-metamodels as media for mixed-signal component optimization, in accordance with an exemplary embodiment of the present disclosure.

FIG. 16 is a diagram of a methodology 1600 that uses schematic-metamodels and layout-metamodels as media for mixed-signal component optimization, in accordance with an exemplary embodiment of the present disclosure. In methodology 1600, a baseline schematic design is first performed. At this point, schematic-metamodels are created from the schematic-netlist for the FoMs. The schematic-metamodels are then analyzed statistically. The schematic-metamodels are then statistically optimized. Based on the optimal results, the optimal-schematic of the mixed-signal components is obtained. The layout of the schematic-optimal design is then designed. From the schematic-optimal layout, a layout-netlist containing RCLK parasitics and transistors is obtained. At this point parasitic-aware metamodels are created for the mixed-signal components for different FoMs. The schematic-optimal-layout-metamodels are then optimized statistically using suitable algorithms. Based on the design parameters obtained from the optimization algorithms, the optimal-layout design is performed.

Figure 17A:
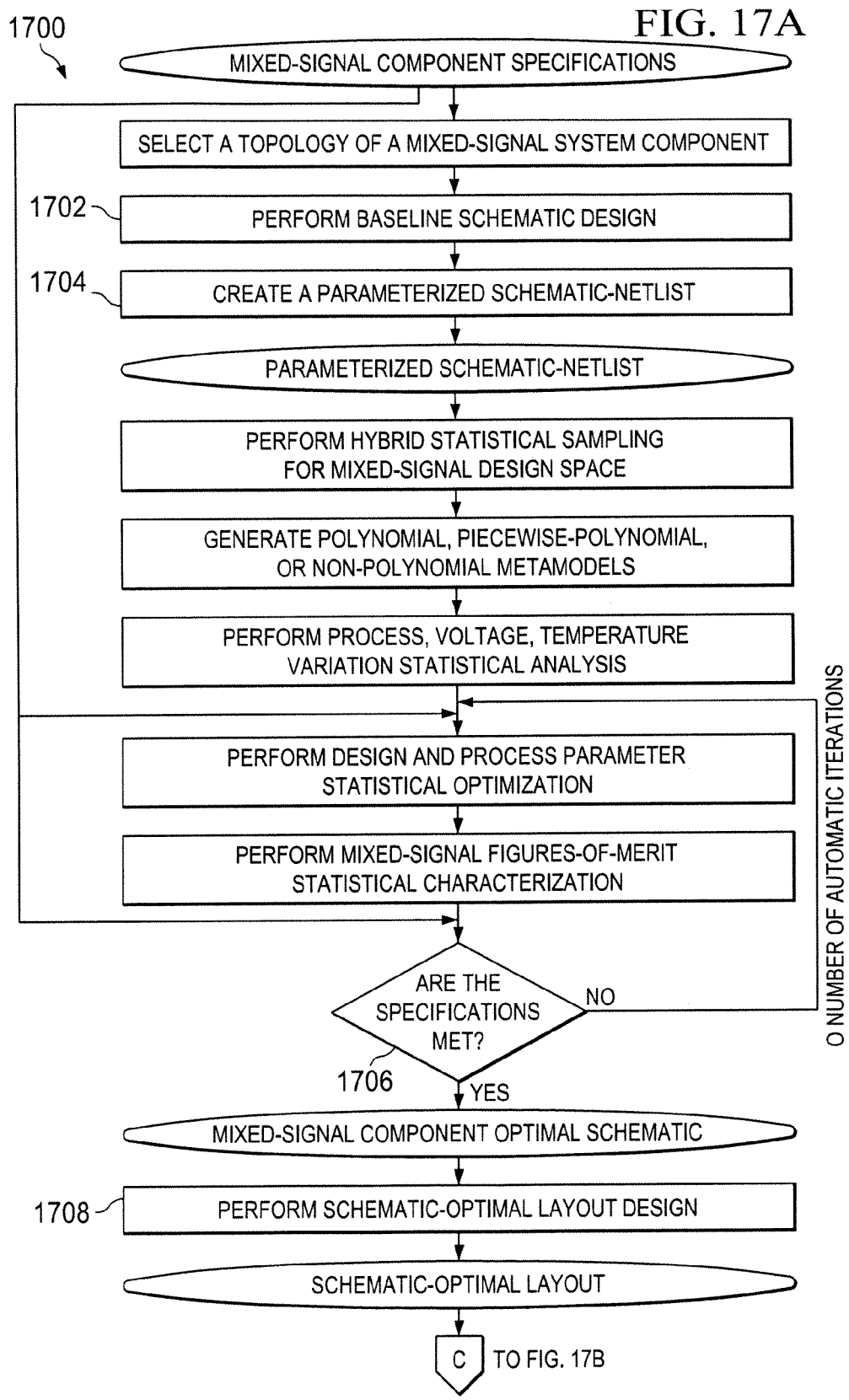
FIGS. 17A and 17B are flowcharts of an algorithm that uses schematic-metamodel automatic optimization and layout-metamodel automatic optimization, in accordance with an exemplary embodiment of the present disclosure.
Figure 17B:
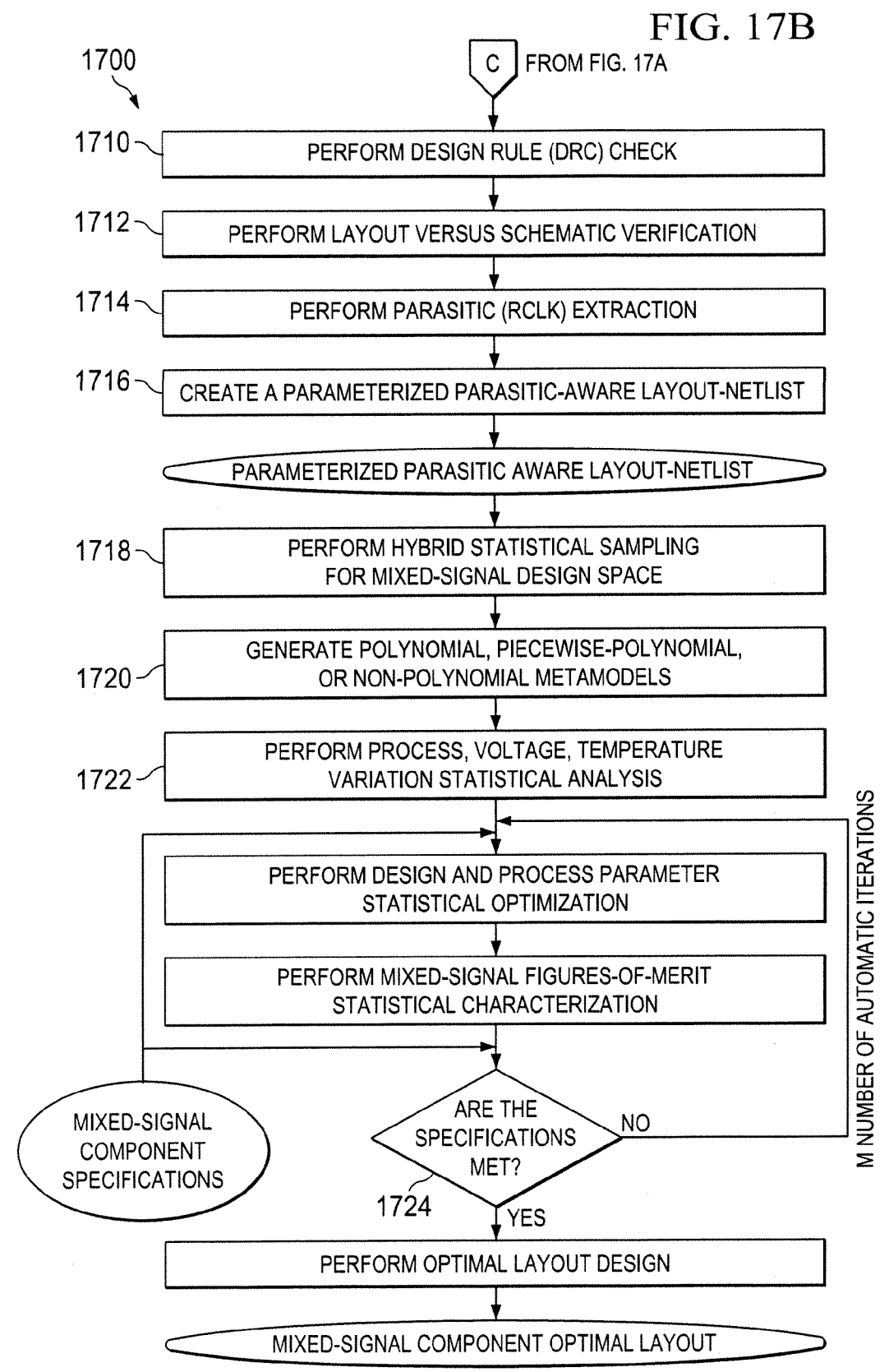

FIGS. 17A and 17B are flowcharts of an algorithm 1700 that uses schematic-metamodel automatic optimization and layout-metamodel automatic optimization, in accordance with an exemplary embodiment of the present disclosure. Algorithm 1700 begins at 1702, where the baseline schematic design of a mixed-signal component is first performed. The algorithm then proceeds to 1704, where a schematic-netlist is created and is then parameterized for the design parameters. The parameterized schematic-netlist can be simple, as it does not contain parasitics. However, it can have a large number of design parameters which depends on the FoM of mixed-signal components and the number of design parameters. Subsequently, schematic-metamodels for each of the FoMs are created from the schematic-netlist using an iterative process that ends at 1706. During this process, statistical analysis of the schematic-metamodels is performed for the target FoMs. The schematic-level statistical characterization is performed using the schematic-metamodels. Then the schematic-metamodels are statistically optimized using suitable algorithms to obtain the optimal-schematic of the mixed-signal components. The iterative process can use Q number of automatic iterations, which is much faster than the optimization over the schematic-netlist. The algorithm then proceeds to 1708.

At 1708, layout of the schematic-optimal design is performed and it is called the schematic-optimal layout. The layout design is subjected to Design Rule Check (DRC) at 1710 and LVS analysis verification at 1712. From the schematic-optimal-layout, a layout-netlist is extracted at 1716 which contains full-blown parasitic RCLK parasitics (from interconnects and transistors) and transistors. Parasitic elements for the active devices, which are geometry (layout) dependent, are also extracted from the layout during this process at 1714 and the relevant parameters are passed to the technology models. The layout-netlist is parameterized to obtain parameterized parasitic-aware layout-netlist. The hybrid statistical sampling of the mixed-signal system design space is performed at 1718 using the parameterized parasitic-aware layout-netlist applying the methodology presented in FIG. 12. From the statistical sampling polynomial, piece-wise-polynomial, or non-polynomial metamodels are generated at 1720 using the methodology presented in FIG. 11. A worst-case or average process, voltage, and temperature variation statistical analysis of the physical design is now performed at 1822 using the layout-metamodels. For tradeoff of speed and accuracy the use of Latin Hypercube Sampling (LHS), DOE-MC analysis and neural-network metamodeling can be used. The layout-metamodels are subjected to different algorithms for statistical optimization under worst-case or average variations, in an iterative process ending at 1724, where it is determined whether the design specifications have been met. The step may take M number of automatic iterations. The layout-level statistical characterization is performed using the modified layout-netlist or from layout-metamodels using updated parameters. The algorithm results in parameter values for which the specifications are met. At this point a layout design is performed for the layout-metamodel-optimal mixed-signal component design.

This is a novel methodology for physical design of nanoscale mixed-signal system components to meet required design specifications using optimization over the schematic-metamodels and layout-metamodels. The optimization has Q iterations over the schematic-metamodels and M iterations over the layout-metamodels. The automatic iterations needed in this design methodology are significantly fewer than the iterations needed in design methodologies presented in FIGS. 4, 7A, 7B, 14A, and 14B. Of course, the accuracy is compromised in the reverse order. In this design methodology, manual iterations can be used twice; first, manual design of the schematic-metamodel-optimal layout cane used and for the second time, manual design of the layout-metamodel-optimal layout can be used. The elimination of manual steps at all other points is very significant for design cycle time, non-recurrent cost, and overall chip cost. It reduces the need of highly skilled personnel to undertake this kind of design. This also reduces chances of layout errors that manual steps would more easily generate. Thus, the design flow can handle large and complex mixed-signal designs in reasonable time with minimal resource usage. The fully extracted physical design is optimized to meet the target specification of the various FoMs such as power and frequency. The speedup compared to a traditional mixed-signal design approach comes from the two-step automatic iterations, only two manual layout design steps, schematic-metamodel optimization (instead of the schematic-netlist optimization), and layout-metamodel optimization (instead of layout-netlist optimization). The layout-metamodel optimization is much faster and needs fewer iterations compared to the layout-netlist of the design methodology in FIGS. 7A, 7B, 14A, and 14B.

Figure 18:
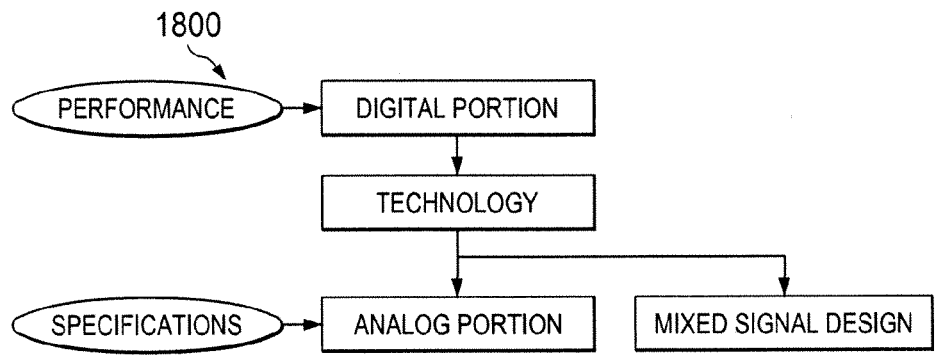
FIG. 18 is a diagram showing alternate approaches for design of analog and digital circuits in AMS-SoCs, in accordance with an exemplary embodiment of the present disclosure.

FIG. 18 is a diagram showing alternate approaches for design of analog and digital circuits in AMS-SoCs, in accordance with an exemplary embodiment of the present disclosure. The digital design is performance driven, whereas the analog design is specification driven. The digital blocks of an AMS-SoC are usually designed "top-down" using abstractions, whereas the analog blocks are designed "bottom-up" without abstractions. The analog portions need numerous design and layout iterations, use significant amount of design cycle time, and are a bottleneck for modern complex AMS-SoCs. As the two design processes do not closely interact with each other during the design cycle, the solution is not optimal for the overall AMS-SoC, resulting in inefficient, low-yield, and costly systems.

Figure 19:
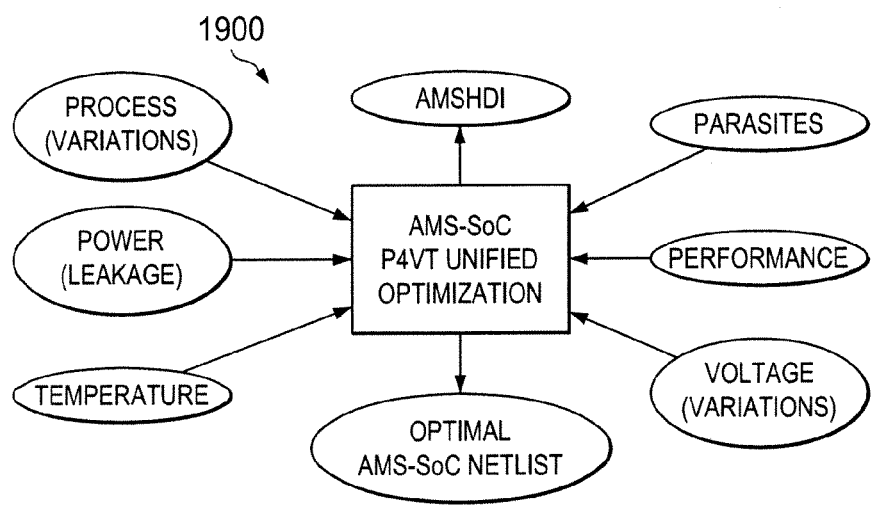
FIG. 19 is a diagram of P4VT optimization for efficient AMS-SoC design exploration, in accordance with an exemplary embodiment of the present disclosure.

FIG. 19 is a diagram 1900 of P4VT optimization for efficient AMS-SoC design exploration, in accordance with an exemplary embodiment of the present disclosure. When AMS-SoCs are fabricated using nano-CMOS, their circuits are strongly impacted by the imperfections of manufacturing processes (e.g. sub-wavelength lithography and chemical-mechanical polishing). Thus, each of the transistors in the AMS-SoC (in a die, different dies, wafers, or lots) is different due to changes in dimensions, impurity levels, or surface charge. However, design decisions are often based on nominal values (rather than statistical distributions) of circuit attributes on the assumption that all transistors are alike. Thus, design decisions based on nominal data are not correct because the used data are either overestimations or underestimations of actual (silicon) data (referred to as the design-to-silicon gap). This in turn leads to loss of yield in AMS-SoC circuits. Nano-CMOS AMS-SoCs need to perform under severe process (P) variations, in the presence of dense interconnects with large parasitic (P) elements while satisfying strict performance (P) and power (P) requirements. Also, nano-CMOS AMS-SoCs must be tolerant of voltage (V) fluctuations and operate under a range of environmental and on-chip temperatures (T). These AMS-SoC designs are called P4VT optimal as depicted in diagram 1900.

Figure 20:
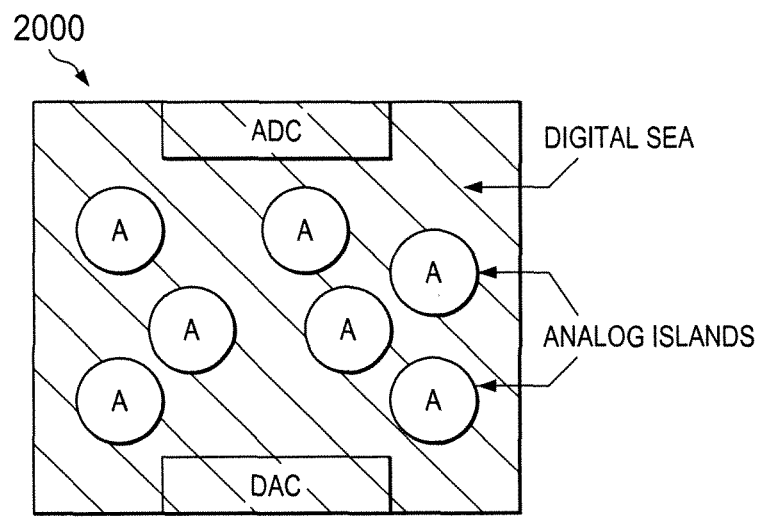
FIG. 20 is a diagram in which a circuit is represented as analog islands in a digital sea for the AMS-SoC, to result in a faster, unified optimization.

The disclosed methodology utilizes a unified (analog and digital) representation of an AMS-SoC for unified simulation and optimization. The analog portion is smaller in transistor count than the digital portion in a typical AMS-SoC. When an AMS-SoC is simulated in the analog domain for accuracy (possibly with digital islands), the design cycle is very slow. Therefore, as shown in FIG. 20, a paradigm shift in which the circuit is represented as "analog islands in a digital sea" for the AMS-SoC, to result in a faster, unified optimization. At the transistor level, the AMS-SoC is a flat transistor netlist. At the architecture-level, while register-transfer level (RTL) abstraction exists for the digital domain, there is no such abstraction for the analog. To overcome this deficiency, we introduce a new abstraction for AMS-SoC called RTL+, where the digital portion is an RTL and the analog portion is a transistor netlist.

Figure 21:
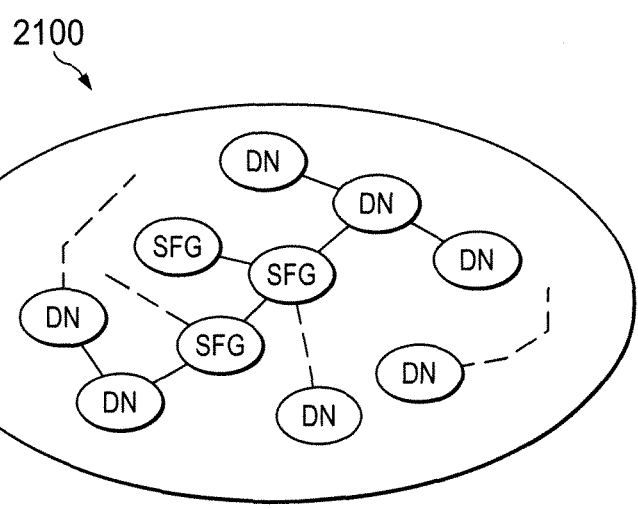
FIG. 21 is a diagram of a graph for mixed signal flow to interpret AMS-SoC as analog islands in a digital sea, in accordance with an exemplary embodiment of the present disclosure.

FIG. 21 is a diagram of a graph 2100 for mixed signal flow to interpret AMS-SoC as analog islands in a digital sea, in accordance with an exemplary embodiment of the present disclosure. From the data structure point of view, graph 2100 is a "graph of graphs" having two distinct types of nodes, (1) digital nodes (DN-Nodes) and (2) signal flow graph nodes (SFG-Nodes). The SFG-Node represents an analog island which is a graph with multiple nodes or a single node graph, called a "Null-Node". A Null-Node is an encapsulation of an analog island. It contains probability density functions (PDFs) of power and center-frequency, etc. of an analog-island. While it represents an analog island, it does not perform operations, like a DN-Node. In the MSFG, each DN-Node represents an operation (e.g. addition) and each edge a dataflow. The conditional statements of an analog/mixed-signal hardware description language (AMSHDL) are handled using comparison operations in the MSFG to support both datapath and control. The MSFG has many advantages. It represents an AMS-SoC as a single graph as opposed to different entities: digital, analog, and interface. The optimization stages are coupled; the solution is optimal for the complete system, rather than an optimal solution for digital only and analog only added together.

Figure 22B:
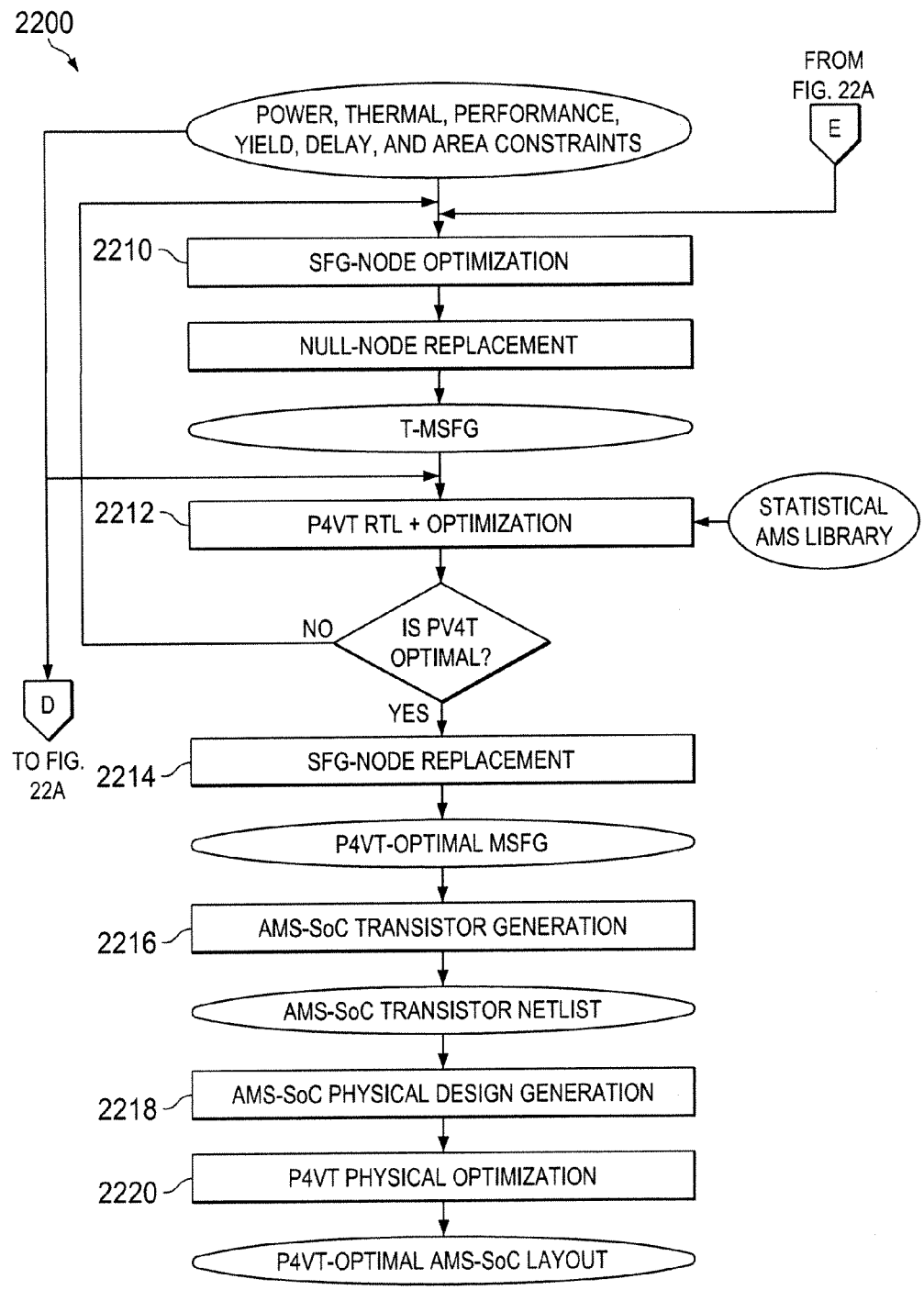

FIGS. 22A and 22B are flowcharts of an algorithm 2200 for AMS-SoC optimization flow for fast and accurate design space exploration, in accordance with an exemplary embodiment of the present disclosure. Algorithm 2200 begins at 2202, where an MSFG representation of the AMS-SoC circuit is generated from its behavioral AMSHDL description. The digital portion of the AMS-SoC can be treated using compilation approaches to obtain the graph. SFGs are representation of analog portions of an AMS-SoC for a specific topology. The analog portion in the initial phase is first created by a designer and a SPICE netlist is extracted. The SPICE netlist is then converted to SFG through a scripting language.

The next two steps for global RTL+ AMS-SoC optimization of the MSFG in which effects of analog and digital portions are accounted for together are at 2204 for Null-Node Replacement and at 2208 for SFG-Node Replacement. The Null-Node Replacement process replaces an SFG-Node with a Null-Node and the reverse process called SFG-Node Replacement replaces a Null-Node with an SFG-Node. These two steps facilitate the AMS-SoC optimization to take advantage of fast digital optimization while maintaining the accuracy of the analog domain, thus making AMS-SoC design fast and accurate.

Figure 23:
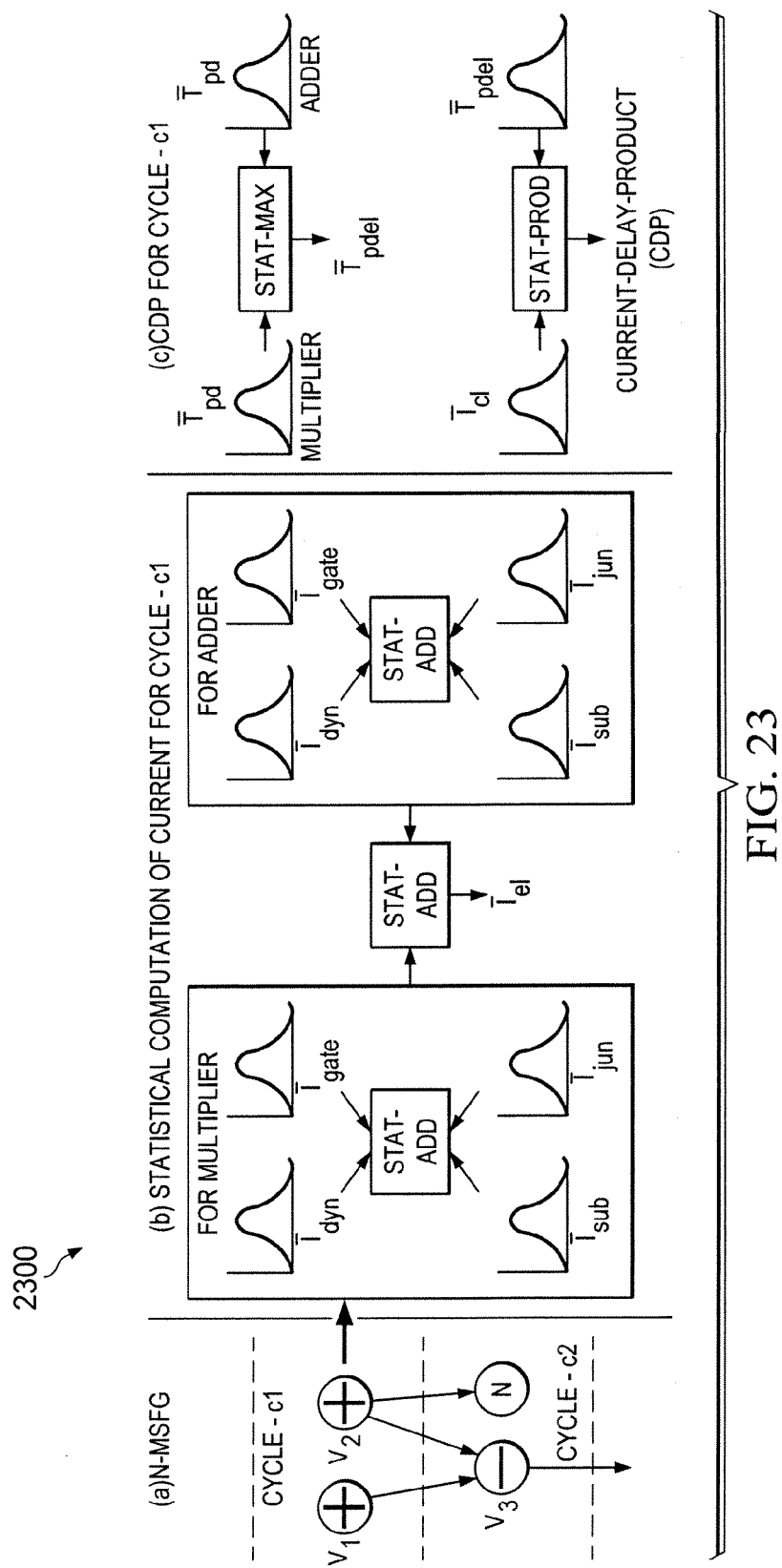
FIG. 23 is a diagram of statistical models in accordance with an exemplary embodiment of the present disclosure.

During the "Initial Null-Node Replacement" an initial SFG-Node is replaced by a Null-Node, thus generating a new graph called N-MSFG at 2206, Null-Node replaced MSFG. The N-MSFG is a sequencing data flow graph, which is a directed acyclic graph. The nodes of the N-MSFG contain operations like addition, no-op, null-node and the edges represent dependency. N-MSFG then goes through the "MSFG Transformation" step. These transformations include compiler-like technology independent optimizations (e.g. loop un-rolling). Hardware-specific transformations (e.g. retiming) are applied to take advantage of the associativity and commutativity of operations. The resulting MSFG is called T-MSFG, transformed Null-Node replaced MSFG, which is also a sequencing data flow graph. T-MSFG goes through "Initial MS Optimization" using nominal AMS cells. This phase is analogous to the RTL+ optimization, but with nominal, not statistical data. At this phase, if the specifications are approximately met, then the topology is accepted, otherwise an alternative topology is selected. In the "SFG-Node Optimization" phase at 2210, the SFG-Nodes are optimized (MSFG local optimization). This stage is important if the analog specifications are completely different from the digital; e.g., phase noise is unique to analog, whereas power and leakage are common to both. This phase is similar to "P4VT Physical Optimization", but with nominal data and without parasitics. During the "P4VT RTL+ Optimization" phase at 2212, objective function PDFs are optimized. Statistical manipulation during the optimization can be used to obtain statistical-addition, statistical-maximum, statistical-minimum, and statistical-product of PDFs. In other words, if $PDF_1$ and $PDF_2$ are two PDFs then quantification can be performed using, Stat-Add($PDF_1$, $PDF_2$), Stat-Prod($PDF_1$, $PDF_2$), Stat-Max($PDF_1$, $PDF_2$), Stat-Min($PDF_1$, $PDF_2$) as shown in the statistical models 2302 of FIG. 23. The statistical models will be used to quantify average current (power), energy delay product (EDP), and leakage delay product (LDP) which are needed during statistical optimization.

During this phase switching and state probabilities at the inputs of different DN-Nodes are estimated. This phase uses the statistical AMS library containing PDFs of attributes of RTL+ components and temperature change when an operation is executed. Once a P4VT-optimal T-MSFG is obtained an "SFG-Node Replacement" returns a P4VT-optimal MSFG at 2214. The "AMS-SoC Transistor Generation" phase generates the complete transistor netlist of the AMS-SoC at 2216. This phase is followed by the "AMS-SoC Physical Generation" to obtain a complete physical design of the AMS-SoC at 2218. The layout of the AMS-SoC is then subjected to "P4VT Physical Optimization" to obtain P4VT-optimal physical design of AMS-SoC at 2220.

Three alternatives for the analog/mixed-signal hardware description language (AMSHDL) description of the AMS-SoC include Verilog-AMS, VHDL-AMS and SystemC-AMS. Current AMSHDL system level modeling does not capture the physical design (layout) information of the target design as it is meant to be fast behavioral simulation only. Thus, the results of behavioral simulation can be very inaccurate. The disclosed paradigm shift integrates layout level information (with full parasitics) in AMSHDL through polynomial metamodels such that system-level simulation of a mixed-signal circuit/system is realistic and as accurate as the true parasitic netlist simulation. The Verilog-AMS language is integrated with Parasitic-Aware Metamodels for ultra-fast and layout-accurate AMS-SoC design exploration and is called Verilog-AMS-PAM. Similarly, VHDL-AMS-PAM or SystemC-AMS-PAM can be developed based on VHDL-AMS or SystemC-AMS, respectively.

An exemplary Verilog-AMS-PAM algorithm for a voltage-controlled oscillator (VCO) is presented below. The part of the basic function related to the input variables is constructed in the initial-block. The remainder of the basic functions are constructed in the always-block. In a similar fashion, non-polynomial metamodels such as, Kriging metamodels and neural-network metamodels, can be integrated in Verilog-AMS, VHDL-AMS, or SystemC-AMS.

```
'timescale 10ps / 1ps 'include "disciplines.vams"
module vco_metamodel (out, in);
... ...
parameter integer K;
initial-block
begin
    out = 0; // Initialize vco digital output
    ... ... // Declare ports and data types
    metaf = $fopen("metamodel.csv", "r");
    while (!$feof(metaf))
    begin
        readfile=$fscanf(metaf, "%e,%e,%e,%e,%e\n", p1, p2, p3, betaf, betap);
        bf[i] = pow(wp,p1) * pow(wn,p2) * betaf;
        bp[i] = pow(wp,p1) * pow(wn,p2) * betap;
        pv[i] = p3; i = i + 1;
    end
    $fclose(metaf);
    ... ...
end
```

-continued

```
always-block
begin
   vc = V(in);
   ... ...
   freq = 0; power = 0;
   for (i = 1; i <= K; i = i + 1)
   begin
      freq=freq+bf[i]*pow(vc, pv[i]); power = power + bp[i] * pow(vc,
      pv[i]);
   end
   ... ...
   #(0.5 / freq / 10p)
   out = ~out;
end
... ...
endmodule
```

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A method for designing complex, mixed signal circuits, comprising:
   generating electronic data using a processor, that defines a baseline schematic design;
   generating a parameterized parasitic-aware netlist, using the processor, that uses the baseline schematic design;
   performing design and process parameter statistical optimization and mixed signal figures of merit statistical characterization, using the processor, that uses the parameterized parasitic-aware netlist and mixed signal component specifications;
   determining whether one or more predetermined design specifications are satisfied;
   optimizing the parameterized parasitic-aware netlist if it is determined that the one more predetermined design specifications are not satisfied; and
   generating electronic data defining a schematic-optimal layout design if it is determined that the one or more predetermined design specifications are satisfied.

2. The method of claim 1 further comprising performing a design rule check verification using the schematic-optimal layout design.

3. The method of claim 2 further comprising performing a layout versus schematic verification using the schematic-optimal layout design.

4. The method of claim 3 further comprising performing parasitic RCLK extraction using the schematic-optimal layout design.

5. The method of claim 4 further comprising generating a parameterized parasitic-aware netlist of the schematic-optimal layout design.

6. The method claim 5 further comprising performing design and process parameter statistical optimization using the parameterized schematic parasitic-aware netlist of the schematic-optimal layout design and the mixed signal component specifications.

7. The method of claim 6 further comprising:
   determining whether one or more predetermined design specifications are satisfied;
   optimizing the parameterized parasitic-aware netlist of the schematic-optimal layout design if it is determined that the one more predetermined design specifications are not satisfied; and
   generating electronic data defining an optimal layout design if it is determined that the one or more predetermined design specifications are satisfied.

8. A method for designing complex, mixed signal circuits, comprising:
   1) generating electronic data defining a baseline schematic design;
   2) generating a parameterized parasitic-aware netlist using the baseline schematic design;
   3) performing design and process parameter statistical optimization and mixed signal figures of merit statistical characterization using the parameterized parasitic-aware netlist and mixed signal component specifications;
   4) determining whether one or more predetermined design specifications are satisfied;
   5) optimizing the parameterized parasitic-aware netlist if it is determined that the one more predetermined design specifications are not satisfied;
   6) generating electronic data defining a schematic-optimal layout design if it is determined that the one or more predetermined design specifications are satisfied; and
   7) wherein one or more of 1) through 6) are performed using one or more processors.

9. The method of claim 8 wherein the design and process parameter statistical optimization comprises statistically analyzing the baseline schematic design to identify one or more figures of merit.

10. The method of claim 8 wherein the design and process parameter statistical optimization comprises statistically optimizing the parameterized parasitic-aware netlist.

11. The method of claim 8 wherein the design and process parameter statistical optimization comprises performing a statistical analysis of the parameterized parasitic-aware netlist for one or more figures of merit using Latin Hypercube Sampling.

12. The method of claim 8 wherein the design and process parameter statistical optimization comprises performing a statistical analysis of the parameterized parasitic-aware netlist for one or more figures of merit using Latin Hypercube Sampling to generate a probability density function for each of the figures of merit.

13. The method of claim 8 wherein the design and process parameter statistical optimization comprises performing a statistical analysis of the parameterized parasitic-aware netlist for one or more figures of merit using Design-Of-Experiments assisted Monte Carlo modeling.

14. The method of claim 8 wherein the design and process parameter statistical optimization comprises generating statistical sampling metamodels.

* * * * *